US011094771B2

(12) United States Patent
Cho et al.

(10) Patent No.: US 11,094,771 B2
(45) Date of Patent: Aug. 17, 2021

(54) DISPLAY DEVICE WITH FIRST AND SECOND INITIALIZATION LINES

(71) Applicant: Samsung Display Co., LTD., Yongin-si (KR)

(72) Inventors: Youngjin Cho, Seoul (KR); Joong-Soo Moon, Hwaseong-si (KR); Changkyu Jin, Anyang-si (KR); Yangwan Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/700,815

(22) Filed: Dec. 2, 2019

(65) Prior Publication Data

US 2020/0185484 A1 Jun. 11, 2020

(30) Foreign Application Priority Data

Dec. 20, 2018 (KR) .......................... 10-2018-0156139

(51) Int. Cl.
*H01L 27/32* (2006.01)
*G09G 3/3266* (2016.01)
*H01L 27/12* (2006.01)

(52) U.S. Cl.
CPC ...... *H01L 27/3276* (2013.01); *H01L 27/3248* (2013.01); *H01L 27/3258* (2013.01); *G09G 3/3266* (2013.01); *H01L 27/124* (2013.01); *H01L 27/1248* (2013.01)

(58) Field of Classification Search
CPC .................................................. H01L 27/3276
USPC ........................................................ 257/40
See application file for complete search history.

(56) References Cited

U.S. PATENT DOCUMENTS

| 9,276,017 | B2 | 3/2016 | Lee |
| 9,887,256 | B2 | 2/2018 | Kim et al. |
| 2009/0231325 | A1* | 9/2009 | Suzuki ..................... G09G 3/20 345/214 |
| 2015/0179727 | A1 | 6/2015 | Kim et al. |
| 2016/0125809 | A1* | 5/2016 | Hwang ................ G09G 3/3258 345/212 |

(Continued)

FOREIGN PATENT DOCUMENTS

| KR | 10-2015-0078248 | 7/2015 |
| KR | 10-2016-0052943 | 5/2016 |

(Continued)

OTHER PUBLICATIONS

Partial European Search Report dated May 4, 2020, issued in European Patent Application No. 19213726.3.

*Primary Examiner* — Ajay Arora
(74) *Attorney, Agent, or Firm* — H.C. Park & Associates, PLC

(57) ABSTRACT

A display device includes a substrate including a pixel area and a peripheral area, a plurality of pixels disposed in the pixel area of the substrate, a first initialization line disposed in the peripheral area of the substrate, the first initialization line being configured to provide a first initialization voltage to the plurality of pixels, and a second initialization line disposed in the peripheral area of the substrate, the second initialization line being configured to provide a second initialization voltage to the plurality of pixels. At least a portion of the first initialization line may overlap with the second initialization line.

25 Claims, 11 Drawing Sheets

(56) References Cited

U.S. PATENT DOCUMENTS

2017/0330927 A1*  11/2017  Lee .................... H01L 27/3262
2018/0006105 A1    1/2018  Kim et al.
2018/0144719 A1    5/2018  Lee et al.
2018/0323222 A1   11/2018  Koide et al.
2020/0243023 A1*   7/2020  Fan ......................... G09G 5/10

FOREIGN PATENT DOCUMENTS

KR      20160052943 A  *  5/2016  ........... G09G 3/3258
KR    10-2017-0114028      10/2017
KR    10-2018-0004382       1/2018

* cited by examiner

DISPLAY DEVICE WITH FIRST AND SECOND INITIALIZATION LINES

CROSS REFERENCE TO RELATED APPLICATION

This application claims priority from and the benefit of Korean Patent Application No. 10-2018-0156139, filed on Dec. 6, 2018, which is hereby incorporated by reference for all purposes as if fully set forth herein.

BACKGROUND

Field

Exemplary implementations of the invention relate generally to a display device.

Discussion of the Background

An organic light emitting display device may include an anode electrode, a cathode electrode, and an emission layer disposed between the anode electrode and the cathode electrode. In the organic light emitting display device, holes injected from the anode electrode and electrons injected from the cathode electrode are combined in the emission layer to form excitons, which emit energy as light.

The organic light emitting display device may include a plurality of pixels each including the anode electrode, the cathode electrode, and the emission layer. The organic light emitting display device may display an image that is a combination of light emitted from the emission layer of each of the pixels.

The organic light emitting display device may include drivers such as a scan driver, an emission driver, a data driver, etc. for driving the pixels. In addition, the organic light emitting display device may include lines for providing voltages to the pixels. Here, the drivers and the lines may be disposed in a peripheral area outside a pixel area in which the pixels are disposed. When the drivers and the lines are disposed in the peripheral area, a dead space of the organic light emitting display device may increase.

The above information disclosed in this Background section is only for understanding of the background of the inventive concepts, and, therefore, it may contain information that does not constitute prior art.

SUMMARY

Devices constructed according to exemplary implementations of the invention provide a display device in which a dead space is reduced.

Additional features of the inventive concepts will be set forth in the description which follows, and in part will be apparent from the description, or may be learned by practice of the inventive concepts.

According to one or more embodiments of the invention, a display device includes a substrate including a pixel area and a peripheral area, a plurality of pixels disposed in the pixel area of the substrate, a first initialization line disposed in the peripheral area of the substrate, the first initialization line being configured to provide a first initialization voltage to the plurality of pixels, and a second initialization line disposed in the peripheral area of the substrate, the second initialization line being configured to provide a second initialization voltage to the plurality of pixels. At least a portion of the first initialization line may overlap with the second initialization line.

An entirety of the first initialization line may overlap with the second initialization line.

The display device may further include a gate insulation layer, a first insulation layer, a second insulation layer, and a third insulation layer sequentially stacked on the substrate. The first initialization line may be disposed on the second insulation layer, and the second initialization line may be disposed on the third insulation layer.

The display device may further include a first connecting line connecting the first initialization line to the plurality of pixels. The first connecting line may include a first connecting portion disposed on the gate insulation layer and directly in contact with the first initialization line.

The display device may further include a second connecting line connecting the second initialization line to the plurality of pixels. The second connection line may include a second connecting portion disposed on the third insulation layer and directly in contact with the second initialization line.

The display device may further include a scan driver and an emission driver disposed in the peripheral area of the substrate.

The scan driver may be disposed between the emission driver and the pixel area, and the first initialization line and the second initialization line may be disposed between the scan driver and the pixel area.

The display device may further include a scan line connecting the scan driver to the plurality of pixels. The scan line may include a scan driver connecting portion disposed on the first insulation layer and crossing the first initialization line and the second initialization line.

The display device may further include an emission control line connecting the emission driver to the plurality of pixels. The emission control line may include an emission driver connecting portion disposed on the gate insulation layer and crossing the first initialization line and the second initialization line.

The first initialization voltage may be greater than the second initialization voltage.

The display device may further include a plurality of data lines configured to provide a data voltage to the plurality of pixels. The first initialization voltage may be less than the data voltage.

Each of the plurality of pixels may include an anode electrode, a cathode electrode, and an emission layer disposed between the anode electrode and the cathode electrode, and the second initialization voltage may be greater than a voltage applied to the cathode electrode.

According to one or more embodiments of the invention, a display device includes a substrate including a pixel area and a peripheral area, a plurality of pixels disposed in the pixel area of the substrate, a driver unit disposed in the peripheral area of the substrate, a first initialization line disposed in the peripheral area of the substrate, the first initialization line being configured to provide a first initialization voltage to the plurality of pixels, and a second initialization line disposed in the peripheral area of the substrate, the second initialization line being configured to provide a second initialization voltage to the plurality of pixels. The second initialization line may overlaps the driver unit.

The second initialization line may not overlap the first initialization line.

A width of the second initialization line may be greater than a width of the first initialization line.

The display device may further include a gate insulation layer, a first insulation layer, a second insulation layer, and a third insulation layer sequentially stacked on the substrate. The first initialization line may be disposed on the second insulation layer, and the second initialization line may be disposed on the third insulation layer.

The display device may further include a first connecting line connecting the first initialization line to the plurality of pixels. The first connecting line may includes a first connecting portion disposed on the gate insulation layer and directly in contact with the first initialization line.

The display device may further include a second connecting line connecting the second initialization line to the plurality of pixels. The second connecting line may include a second connecting portion disposed on the third insulation layer and directly in contact with the second initialization line.

The driver unit may include an emission driver and a scan driver disposed between the emission driver and the pixel area, and the second initialization line may overlap the scan driver.

The scan driver may include a scan active pattern disposed on the substrate, a first scan conductive portion disposed on the gate insulation layer, a second scan conductive portion disposed on the first insulation layer, and a third scan conductive portion disposed on the second insulation layer.

The display device may further include a scan line connecting the scan driver to the plurality of pixels. The scan line may include a scan driver connecting portion disposed on the first insulation layer and crossing the first initialization line.

The display device may further include an emission control line connecting the emission driver to the plurality of pixels. The emission control line may include an emission driver connecting portion disposed on the gate insulation layer and crossing the first initialization line and the second initialization line.

The first initialization voltage may be greater than the second initialization voltage.

The display device may further include a plurality of data lines configured to provide a data voltage to the plurality of pixels. The first initialization voltage may be less than the data voltage.

Each of the plurality of pixels may include an anode electrode, a cathode electrode, and an emission layer disposed between the anode electrode and the cathode electrode, and the second initialization voltage may be greater than a voltage applied to the cathode electrode.

In the display device constructed according to the embodiments, within the peripheral area, the first initialization line and the second initialization line may be overlapped with each other, or the second initialization line may overlap the driver unit. Therefore, a dead space of the display device may be decreased.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
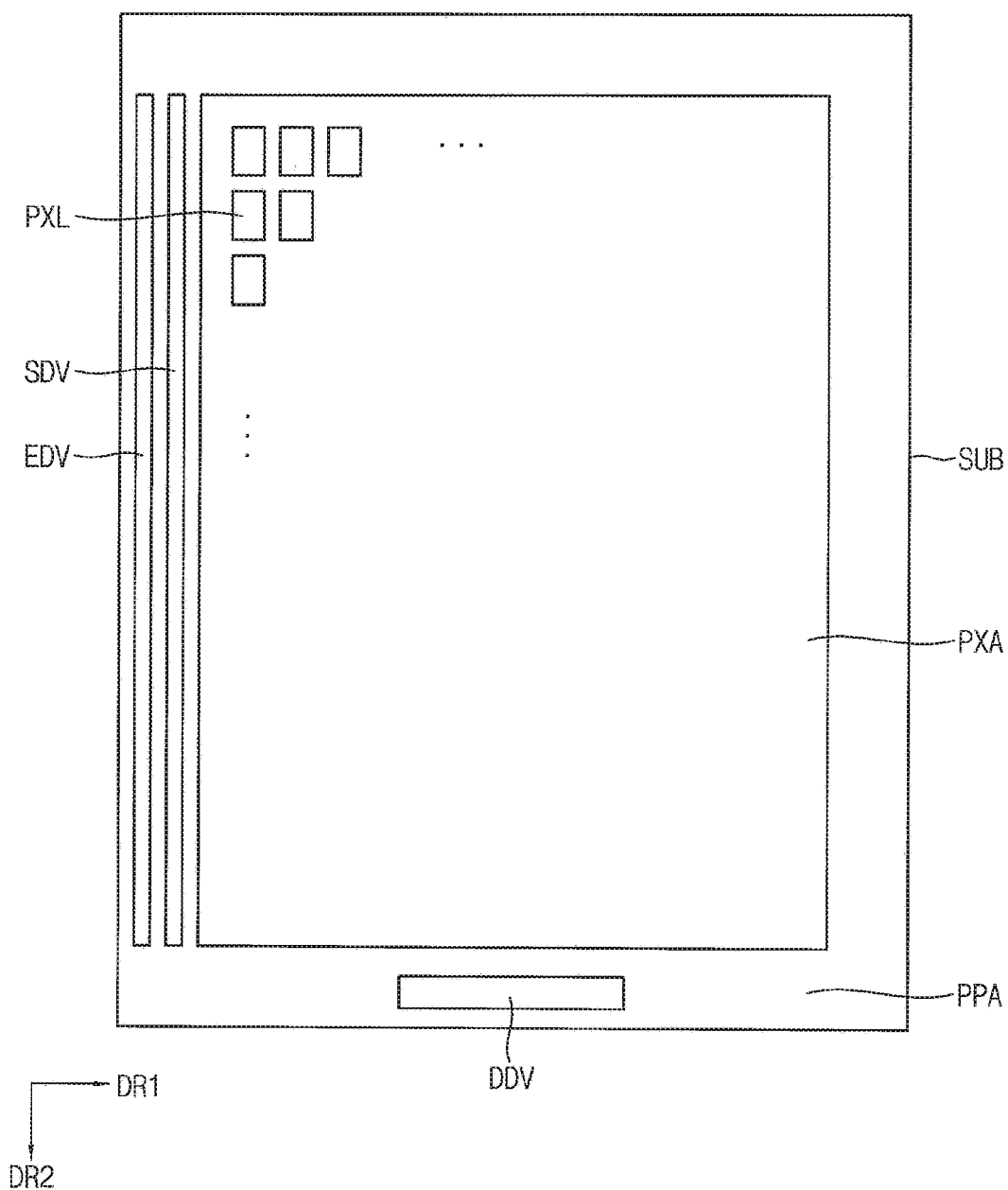
FIG. 1 is a plan view schematically illustrating a display device constructed according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, display devices in accordance with embodiments will be explained in detail with reference to the accompanying drawings.

FIG. 1 is a plan view schematically illustrating a display device constructed according to an exemplary embodiment.

Referring to FIG. 1, a display device constructed according to an exemplary embodiment may include a substrate SUB, a plurality of pixels PXL disposed on the substrate SUB, a driver unit disposed on the substrate SUB and driving the pixels PXL, and a wiring unit connecting the pixels PXL and the driver unit.

The substrate SUB may have a pixel area PXA and a peripheral area PPA. The pixel area PXA may be an area in which the pixels PXL displaying an image are disposed. The peripheral area PPA may be an area in which the pixels PXL are not disposed and an image is not displayed. The peripheral area PPA may include the driver unit driving the pixels PXL and a portion of the wiring unit connecting the pixels PXL and the driver unit. The peripheral area PPA may correspond to a bezel in the display device, and a width of the bezel may be determined according to a width of the peripheral area PPA.

The peripheral area PPA may be located at least on one side of the pixel area PXA. In an exemplary embodiment, the peripheral area PPA may surround a perimeter of the pixel area PXA. In an exemplary embodiment, the peripheral area PPA may include a horizontal portion extended in a first direction DR1 and a vertical portion extended in a second direction DR2 crossing the first direction DR1. A pair of vertical portions of the peripheral area PPA, which are spaced apart from each other in the first direction DR1 of the pixel area PXA, may be provided.

The pixels PXL may be disposed within the pixel area PXA on the substrate SUB. Each pixel PXL may be a minimum unit displaying an image. The pixel PXL may include an organic light emitting element emitting white light and/or color light. Each pixel PXL may emit any one color among red, green, and blue, however, is not limited thereto. For example, each pixel PXL may also emit one color among cyan, magenta, yellow, and white.

The pixels PXL may be arranged in a matrix form along rows extended in the first direction DR1 and columns extended in the second direction DR2. However, the arrangement form of the pixels PXL is not particularly limited, and the pixels PXL may be arranged in various forms.

The driver unit may provide signals to the pixels PXL through the wiring unit, and thus, may control the driving of the pixels PXL. The wiring unit is omitted in FIG. 1 for convenience of the description, and the wiring unit will be described below.

The driver unit may include a scan driver SDV providing scan signals to the pixels PXL through scan lines, an emission driver EDV providing emission control signals to the pixels PXL through emission control lines, and a data driver DDV providing data voltages to the pixels PXL through data lines.

The scan driver SDV may be disposed in the vertical portion of the peripheral area PPA. The peripheral area PPA may be provided with the pair of vertical portions which are spaced apart from each other in the first direction DR1 of the pixel area PXA, and the scan driver SDV may be disposed in at least one of the vertical portions of the peripheral area PPA. The scan driver SDV may be elongated in the second direction DR2 of the peripheral area PPA.

In an exemplary embodiment, the scan driver SDV may be directly mounted on the substrate SUB. When the scan driver SDV is directly mounted on the substrate SUB, the scan driver SDV may be formed together with the pixels PXL during a process of forming the pixels PXL. However, the position in which the scan driver SDV is provided and the method of providing the scan driver SDV are not limited thereto. For example, in another exemplary embodiment, the scan driver SDV may be formed in a separate chip and provided on the substrate SUB as a chip-on-glass, or may be mounted on a printed circuit board and connected to the substrate SUB through a connecting member.

The emission driver EDV may also be disposed in the vertical portion of the peripheral area PPA, similar to the scan driver SDV. The emission driver EDV may be disposed in at least one of the vertical portions of the peripheral area PPA. The emission driver EDV may be elongated in the second direction DR2 of the peripheral area PPA.

In an exemplary embodiment, the emission driver EDV may be directly mounted on the substrate SUB. When the emission driver EDV is directly mounted on the substrate SUB, the emission driver EDV may be formed together with the pixels PXL during a process of forming the pixels PXL. However, the position in which the emission driver EDV and the method of providing the emission driver EDV are not limited thereto. For example, in another exemplary embodiment, the emission driver EDV may be formed in a separate chip and provided on the substrate SUB as a chip-on-glass, or may be mounted on a printed circuit board and connected to the substrate SUB through a connecting member.

In an exemplary embodiment, the scan driver SDV and the emission driver EDV may be adjacent to each other, and may be formed at only one of the pair of vertical portions of the peripheral area PPA. However, the present disclosure is not limited thereto, and the disposition of the scan driver SDV and the emission driver EDV may be changed in various scheme. For example, the scan driver SDV may be disposed in at one side of the vertical portions of the peripheral area PPA, and the emission driver EDV may be disposed at the other side of the vertical portions of the peripheral area PPA. As another example, the scan driver SDV may be disposed at both sides of the vertical portions of the peripheral area PPA, and the emission driver EDV may be disposed at only one side of the vertical portions of the peripheral area PPA.

The data driver DDV may be disposed in the peripheral area PPA. For example, the data driver DDV may be disposed in the horizontal portion of the peripheral area PPA. The data driver DDV may be elongated in the first direction DR1 of the peripheral area PPA.

The driver unit may further include a timing controller. The timing controller may control the scan driver SDV, the emission driver EDV, and the data driver DDV.

The timing controller may be connected to the scan driver SDV, the emission driver EDV, and the data driver DDV through lines by various schemes. The disposition position of the timing controller is not particularly limited. For example, the timing controller may be mounted on a printed circuit board and connected to the scan driver SDV, the emission driver EDV, and the data driver DDV through a flexible printed circuit board, and the printed circuit board may be disposed at various positions, such as on one side of the substrate SUB, a rear surface of the substrate SUB, etc.

Figure 2:
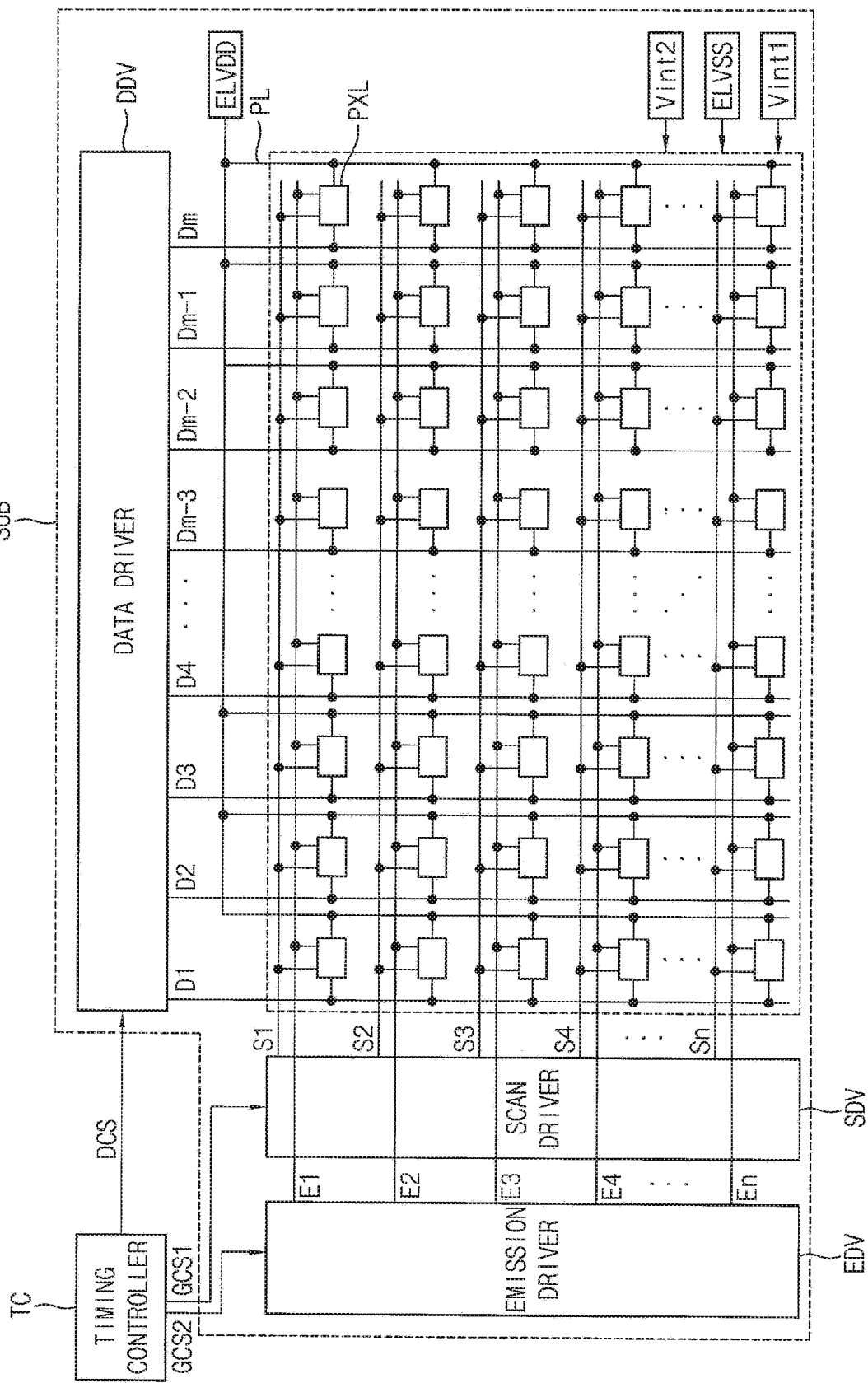
FIG. 2 is a diagram illustrating a display device constructed according to an embodiment.

FIG. 2 is a diagram illustrating a display device constructed according to an exemplary embodiment.

Referring to FIG. 2, a display device constructed according to an exemplary embodiment may include pixels PXL, a driver unit, and a wiring unit. The driver unit may include a scan driver SDV, an emission driver EDV, a data driver DDV, and a timing controller TC. The wiring unit may provide signals to the pixels PXL from the driver unit, and may include scan lines S1 to Sn, emission control lines E1 to En, data lines D1 to Dm, and a power line PL.

The pixels PXL may be connected to the scan lines S1 to Sn, the emission control lines E1 to En, the data lines D1 to Dm, and the power line PL. When scan signals are supplied from the scan lines S1 to Sn, the pixels PXL may receive data voltages from the data lines D1 to Dm.

The pixels PXL may receive voltages from a first power source ELVDD, a second power source ELVSS, a first initialization power source Vint1, and a second initialization power source Vint2. Here, a first voltage of the first power source ELVDD may be applied to the pixels PXL through the power line PL.

Each of the pixels PXL may include a driving transistor and an organic light emitting element. The driving transistor may control the quantity of current flowing from the first power source ELVDD to the second power source ELVSS via the organic light emitting element in response to the data voltage. Here, a gate electrode of the driving transistor may be initialized by a first initialization voltage of the first initialization power source Vint1 before the data voltage is supplied. To this end, the first initialization voltage may be less than the data voltage.

After the data voltage is supplied, an anode electrode of the organic light emitting element may be initialized by a second initialization voltage of the second initialization power source Vint2. Here, the second initialization voltage may be less than the first initialization voltage. Further, the second initialization voltage may be greater than a second voltage of the second power source ELVSS.

The scan driver SDV may supply scan signals to the scan lines S1 to Sn in response to a first gate control signal GCS1 from the timing controller TC. For example, the scan driver SDV may sequentially supply the scan signals to the scan lines S1 to Sn. When the scan signals are sequentially supplied to the scan lines S1 to Sn, the pixels PXL may be sequentially selected in a unit of a pixel row.

The emission driver EDV may supply emission control signals to the emission control lines E1 to En in response to a second gate control signal GCS2 from the timing controller TC. For example, the emission driver EDV may sequentially supply the emission control signals to the emission control lines E1 to En.

The data driver DDV may supply data voltages to the data lines D1 to Dm in response to a data control signal DCS. The data lines D1 to Dm may supply the data voltages to the pixels PXL according to the scan signals.

The timing controller TC may supply the gate control signals GCS1 and GCS2, which are generated based on timing signals supplied from the outside, to the scan driver SDV and the emission driver EDV, and may supply the data control signal DCS to the data driver DDV.

Each of the gate control signals GCS1 and GCS2 may include a start pulse and clock signals. The start pulse may control a timing of a first scan signal or a first emission control signal. The clock signals may be used for shifting the start pulse.

The data control signal DCS may include a source start pulse and clock signals. The source start pulse may control a sampling start time point of data. The clock signals may be used for controlling a sampling operation.

Figure 3:
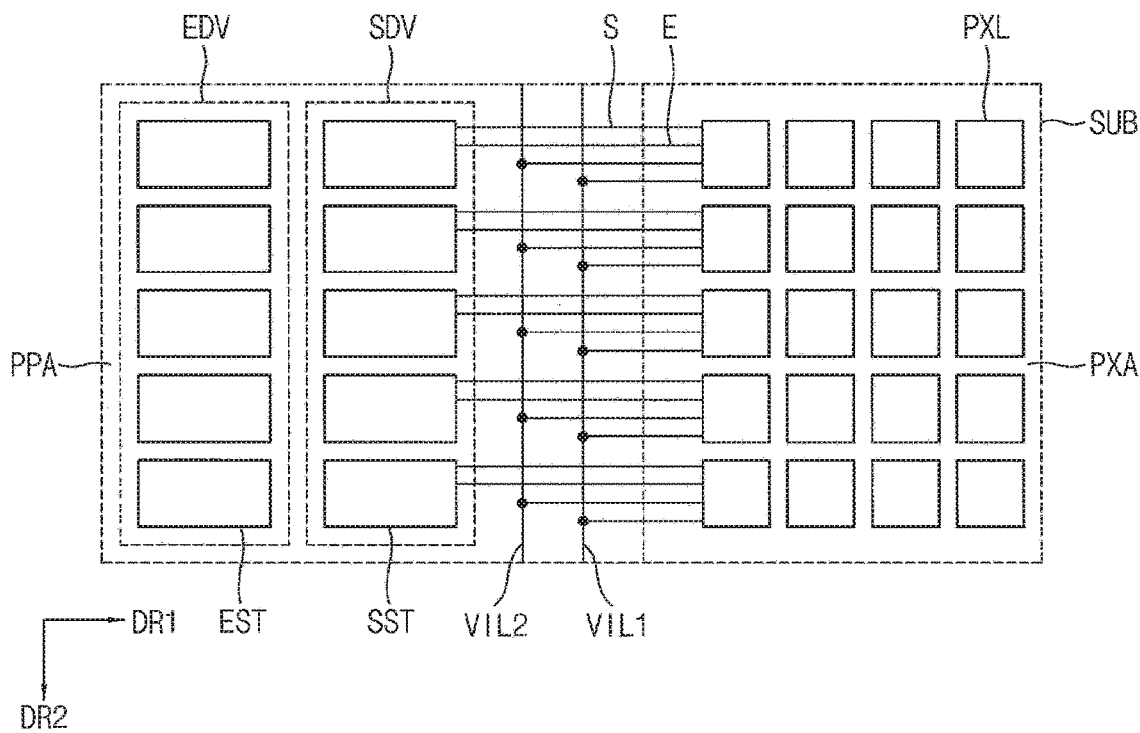
FIG. 3 is a plan view schematically illustrating a portion of a display device constructed according to an embodiment.

FIG. 3 is a plan view schematically illustrating a portion of a display device constructed according to an exemplary embodiment. For example, FIG. 3 may illustrate a part of the vertical portion of the peripheral area PPA and a part of the pixel area PXA adjacent thereto in FIG. 1.

Referring to FIG. 3, a substrate SUB may include a pixel area PXA and a peripheral area PPA, and pixels PXL may be disposed within the pixel area PXA on the substrate SUB.

The pixels PXL may include a plurality of pixel rows arranged one by one in the second direction DR2, and the pixel rows may be extended in the first direction DR1. The pixels PXL may include a plurality of pixel columns arranged one by one in the first direction DR1, and pixel columns may be extended in the second direction DR2. In other words, the pixels PXL may be disposed in a predetermined matrix form.

The driver unit may be disposed within the peripheral area PPA on the substrate SUB. The wiring unit may connect the pixels PXL and the driver unit.

The driver unit may include a scan driver SDV connected to the pixels PXL through scan lines S. The scan driver SDV may be disposed to be adjacent to the pixel area PXA.

The scan driver SDV may include a plurality of scan stages SST. Each of the scan stages SST may be connected to any one of the scan lines S. The scan line S may connect an output terminal of the scan stage SST and a scan signal input terminal of an outermost pixel PXL of a pixel row, and the scan stages SST may be driven in response to a clock signal. The scan stages SST may be substantially implemented using the same circuit. Each of the scan stages SST may correspond to a pixel row included in the pixel area PXA, and may supply the scan signal to the pixels PXL arranged in the corresponding pixel row.

The driver unit may include an emission driver EDV connected to the pixels PXL through emission control lines E. The emission driver EDV may be disposed to be adjacent to the scan driver SDV. The scan driver SDV may be disposed between the emission driver EDV and the pixel area PXA, and thus, the emission driver EDV may be disposed farther from the pixel area PXA than the scan driver SDV is from the pixel area PXA.

The emission driver EDV may include a plurality of emission stages EST. Each of the emission stages EST may be connected to any one of the emission control lines E. The emission control line E may connect an output terminal of an emission stage EST and an emission signal input terminal of an outermost pixel PXL of a pixel row, and the emission stages EST may be driven in response to a clock signal. The emission stages EST may be implemented using the same circuit. Each of the emission stages EST may correspond to a pixel row included in the pixel area PXA, and may supply the emission control signal to the pixels PXL arranged in the corresponding pixel row.

For convenience of the description, FIG. 3 illustrates that the scan line S is connected to only the outermost pixel PXL of each pixel row, however, the scan line S may be connected to all of the pixels PXL provided in each pixel row. Likewise, the emission control line E may be connected to all of the pixels PXL provided in each pixel row.

The wiring unit may provide signals from the driver unit to the pixels PXL, and may include the scan lines S, the emission control lines E, a first initialization line VIL1, and a second initialization line VIL2.

The first initialization line VIL1 and the second initialization line VIL2 may be electrically connected to the pixels PXL. The first initialization line VIL1 and the second initialization line VIL2 may be extended along the border of the pixel area PXA in the peripheral area PPA. The initialization lines VIL1 and VIL2 may provide the initialization voltages from the initialization power sources Vint1 and Vint2 in FIG. 2 to the pixels PXL.

For convenience of the description, FIG. 3 illustrates that the first initialization line VIL1 and the second initialization line VIL2 are spaced apart from each other and the second initialization line VIL2 and the scan driver SDV are spaced apart from each other. However, in the present embodiment, the first initialization line VIL1 and the second initialization line VIL2 may be overlapped with each other, or the second initialization line VIL2 and the scan driver SDV may be overlapped with each other.

Hereinafter, the pixels PXL illustrated in FIG. 3 will be described with reference to FIGS. 4, 5, 6, and 7.

Figure 4:
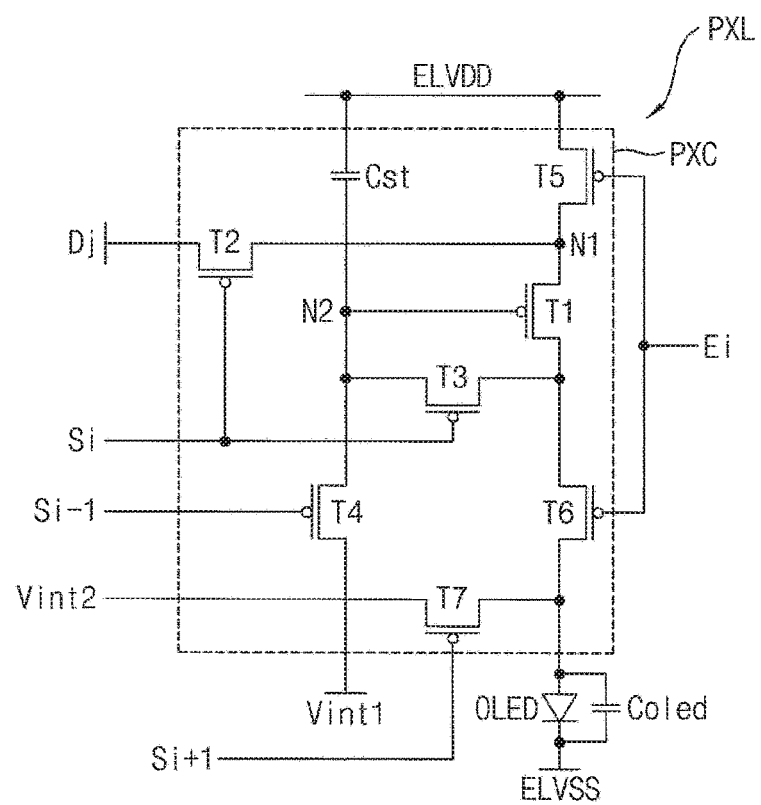
FIG. 4 is a circuit diagram illustrating a pixel of the display device in FIG. 3.

FIG. 4 is a circuit diagram illustrating the pixel PXL of the display device in FIG. 3. For convenience of the description, FIG. 4 illustrates a pixel PXL connected to a j-th data line Dj and an i-th scan line Si.

Referring to FIG. 4, the pixel PXL according to an exemplary embodiment may include a pixel circuit PXC and an organic light emitting element OLED.

The pixel circuit PXC may include a first transistor T1, a second transistor T2, a third transistor T3, a fourth transistor T4, a fifth transistor T5, a sixth transistor T6, a seventh transistor T7, and a storage capacitor Cst.

An anode electrode of the organic light emitting element OLED may be connected to the pixel circuit PXC, and a cathode electrode of the organic light emitting element OLED may be connected to a second power source ELVSS. The organic light emitting element OLED may generate light having predetermined brightness in response to the quantity of current supplied from the pixel circuit PXC.

The pixel circuit PXC may initialize a gate electrode of the first transistor T1 with a first initialization voltage of the first initialization power source Vint1 when a scan signal is supplied to an (i−1)-th scan line Si−1. Further, the pixel circuit PXC may receive a data voltage from a data line Dj via the second transistor T2 when a scan signal is supplied to an i-th scan line Si. Further, the pixel circuit PXC may initialize the anode electrode of the organic light emitting element OLED with a second initialization voltage of the second initialization power source Vint2 when a scan signal is supplied to an (i+1)-th scan line Si+1. The pixel circuit PXC receiving the data voltage may control the quantity of current flowing from a first power source ELVDD to the second power source ELVSS via the organic light emitting element OLED when an emission control signal is supplied to an i-th emission control line Ei.

A first electrode T1 of the first transistor T1 may be connected to a first node N1, and a second electrode of the first transistor T1 may be connected to a first electrode of the sixth transistor T6. A gate electrode of the first transistor T1 may be connected to a second node N2. The first transistor T1 may control the quantity of current flowing from the first power source ELVDD to the second power source ELVSS via the organic light emitting element OLED in response to a voltage charged in the storage capacitor Cst.

The second transistor T2 may be connected between the data line Dj and the first node N1. A gate electrode of the second transistor T2 may be connected to an i-th scan line Si. The second transistor T2 may be turned on to supply a data voltage from the data line Dj to the first node N1 when a scan signal is supplied to the i-th scan line Si.

A first electrode of the third transistor T3 may be connected to the second electrode of the first transistor T1, and a second electrode of the third transistor T3 may be connected to the second node N2. A gate electrode of the third transistor T3 may be connected to the i-th scan line Si. The third transistor T3 may be turned on to connect the first transistor T1 in a diode form when a scan signal is supplied to the i-th scan line Si.

A first electrode of the fourth transistor T4 may be connected to the second node N2, and a second electrode of the fourth transistor T4 may be connected to a first initialization power source Vint1. A gate electrode of the fourth transistor T4 may be connected to an (i−1)-th scan line Si−1. The fourth transistor T4 may be turned on to supply the first initialization voltage of the first initialization power source Vint1 to the second node N2 when a scan signal is supplied to the (i−1)-th scan line Si−1.

A first electrode of the fifth transistor T5 may be connected to the first power source ELVDD, and a second electrode of the fifth transistor T5 may be connected to the first node N1. A gate electrode of the fifth transistor T5 may be connected to an emission control line Ei. The fifth transistor T5 may be turned on when an emission control signal is supplied to the emission control line Ei.

A first electrode of the sixth transistor T6 may be connected to the second electrode of the first transistor T1, and a second electrode of the sixth transistor T6 may be connected to the anode electrode of the organic light emitting element OLED. A gate electrode of the sixth transistor T6 may be connected to the emission control line Ei. The sixth transistor T6 may be turned on when the emission control signal is supplied to the emission control line Ei.

The storage capacitor Cst may be connected between the first power source ELVDD and the second node N2. The storage capacitor Cst may charge a voltage corresponding to the data voltage and a threshold voltage of the first transistor T1.

The seventh transistor T7 may be connected between the anode electrode of the organic light emitting element OLED and the second initialization power source Vint2. A gate electrode of the seventh transistor T7 may be connected to an (i+1)-th scan line Si+1. The seventh transistor T7 may be turned on when a scan signal is supplied to the (i+1)-th scan line Si+1 to supply the second initialization voltage of the second initialization power source Vint2 to the anode electrode of the organic light emitting element OLED.

When the second initialization voltage is supplied to the anode electrode of the organic light emitting element OLED, a parasitic capacitor (hereinafter, referred to as an "organic capacitor Coled") of the organic light emitting element OLED may be discharged. When the organic capacitor Coled is discharged, a black expression capability may be improved.

To describe in detail, the organic capacitor Coled may charge a predetermined voltage in response to a current supplied from the pixel circuit PXC during a previous frame period. When the organic capacitor Coled is charged, the organic light emitting element OLED may easily emit light even with a low current.

A black data voltage may be supplied to the pixel circuit PXC during a current frame period. When the black data voltage is supplied, the pixel circuit PXC ideally would not supply a current to the organic light emitting element OLED. However, even though the black data voltage is supplied, the pixel circuit PXC formed of the transistors may supply a predetermined leakage current to the organic light emitting element OLED. In this case, when the organic capacitor Coled is in a charging state, the organic light emitting element OLED may minutely emit light, and thus the black expression capability may be degraded.

In contrast, according to the present embodiment, when the organic capacitor Coled is discharged by the second initialization power source Vint2, the organic light emitting element OLED may be set in a non-emission state despite there being a leakage current. In other words, in the present embodiment, the pixel circuit PXC may supply the second initialization voltage to the anode electrode of the organic light emitting element OLED by using the second initialization power source Vint2, thereby improving the black expression capability.

The second initialization voltage of the second initialization power source Vint2 may be less than the first initialization voltage of the first initialization power source Vint1 and greater than a second voltage of the second power source ELVSS so that the organic capacitor Coled may be stably discharged. For example, the second initialization voltage may correspond to a voltage obtained by adding a threshold voltage of the organic light emitting element OLED to the second voltage.

In addition, in the present embodiment, when the first initialization power source Vint1 and the second initialization power source Vint2 are separated, a leakage current from the pixel circuit PXC may be minimized.

To describe in detail, the second voltage of the second power source ELVSS applied to the cathode electrode of the organic light emitting element OLED may be reduced to implement high brightness. When the second voltage decreases, the quantity of current supplied from the pixel circuit PXC to the organic light emitting element OLED increases, and thus, brightness of the organic light emitting element OLED may increase.

Here, when the second voltage of the second power source ELVSS decreases, the second initialization voltage of the second initialization power source Vint2 may also decrease. Accordingly, in a case in which the first initialization power source Vint1 and the second initialization power source Vint2 are not separated, when the second voltage of the second power source ELVSS decreases, a leakage current flowing from the pixel circuit PXC to the first initialization power source Vint1 may increase.

On the other hand, when the first initialization power source Vint1 and the second initialization power source Vint2 are separated, like the present embodiment, the first initialization voltage of the first initialization power source Vint1 may be set regardless of the second power source ELVSS. Particularly, in the present embodiment, the first initialization voltage of the first initialization power source Vint1 may be greater than the second voltage of the second power source ELVSS and the second initialization voltage of the second initialization power source Vint2, thereby minimizing a leakage current from the pixel circuit PXC to the first initialization power source Vint1.

Further, when the second initialization voltage of the second initialization power source Vint2 is greater than the second voltage of the second power source ELVSS, a leakage current flowing from the pixel circuit PXC to the second initialization power source Vint2 during an emission period of the organic light emitting element OLED may be minimized, and thus, brightness of the organic light emitting element OLED may increase.

Figure 5:
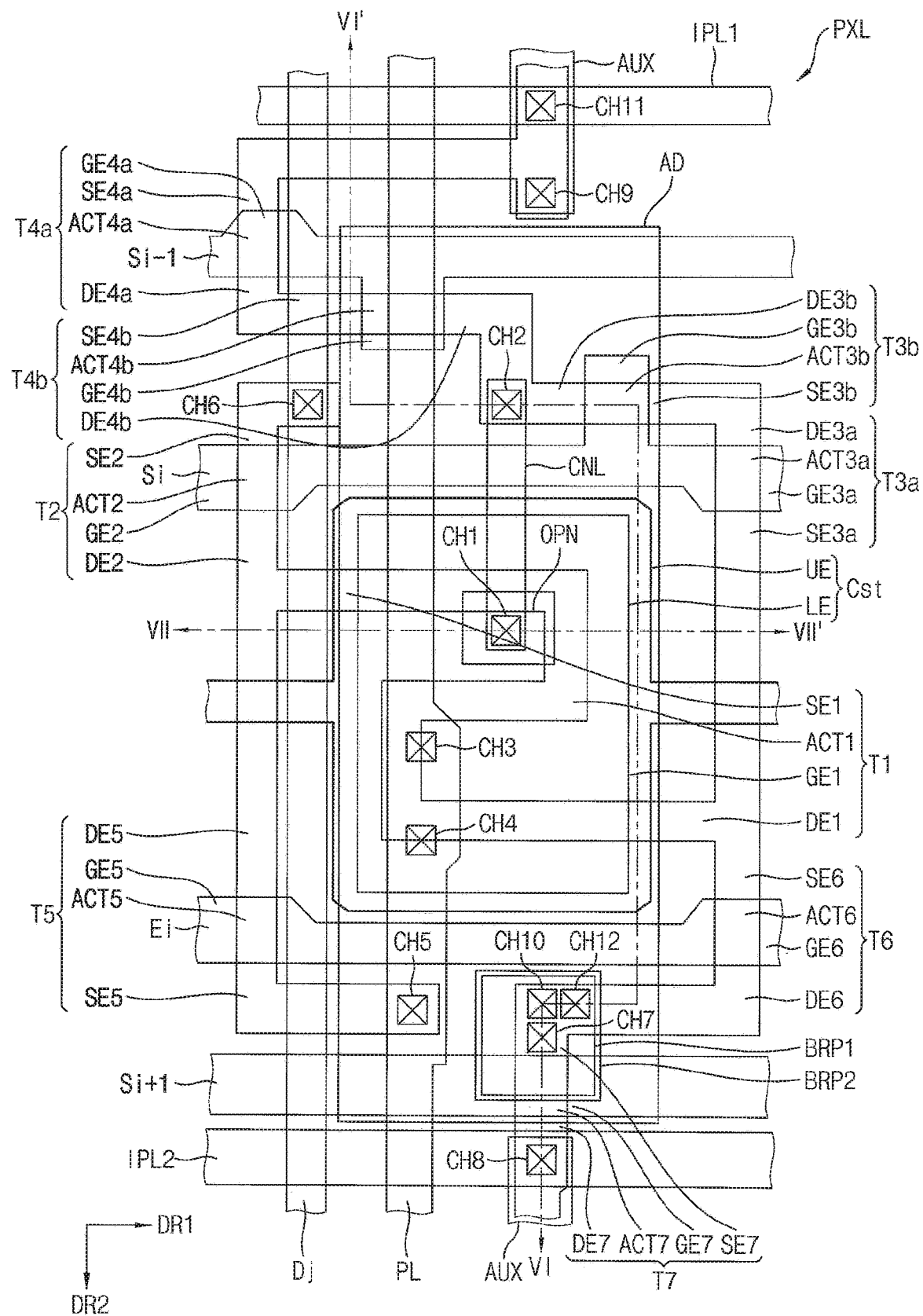
FIG. 5 is a layout view illustrating the pixel of the display device in FIG. 4.
Figure 6:
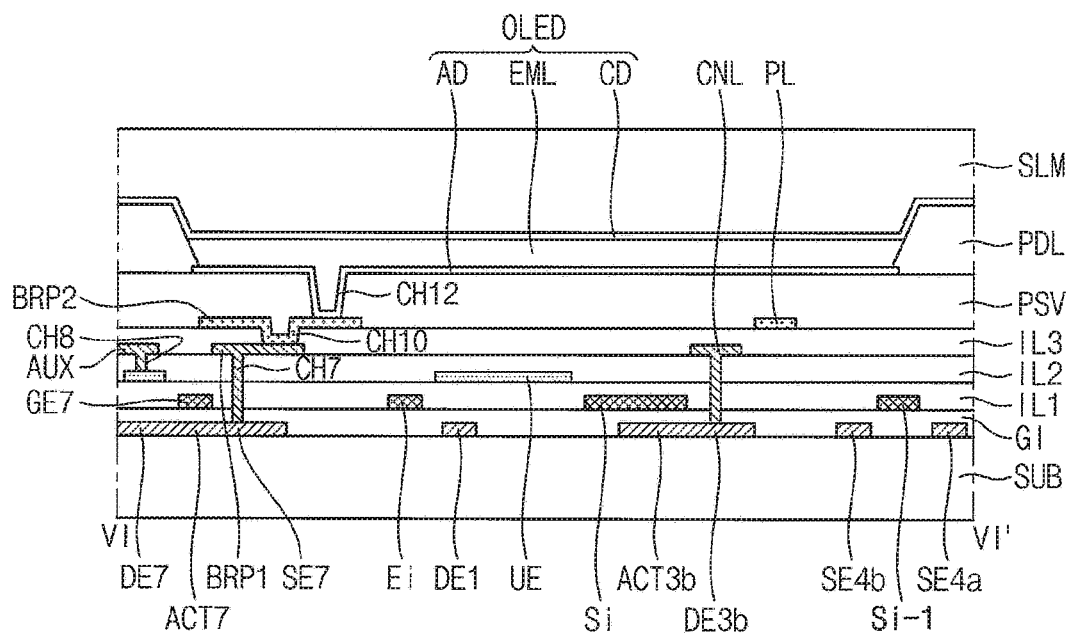
FIG. 6 is a cross-sectional view taken along a sectional line VI-VI' in FIG. 5.
Figure 7:
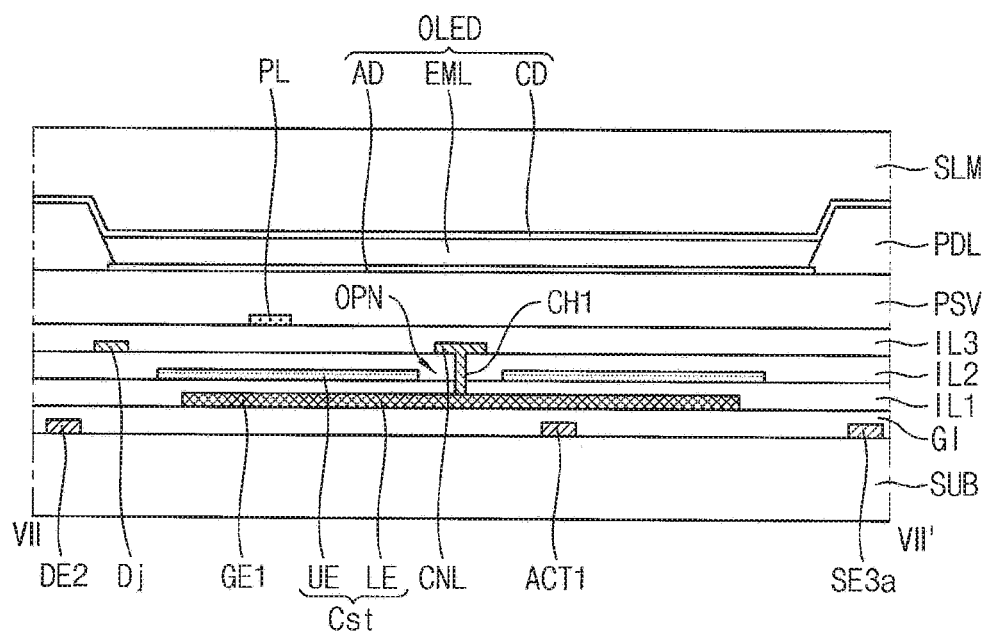
FIG. 7 is a cross-sectional view taken along a sectional line VII-VII' in FIG. 5.

FIG. 5 is a layout view illustrating the pixel PXL of the display device in FIG. 4. FIG. 6 is a cross-sectional view taken along a sectional line VI-VI' in FIG. 5. FIG. 7 is a cross-sectional view taken along a sectional line VII-VII' in FIG. 5.

FIGS. 5, 6, and 7 illustrate scan lines Si−1, Si, and Si+1, an emission control line Ei, a power line PL, and a data line Dj which are connected to one pixel PXL disposed in an i-th row and a j-th column in the pixel area PXA. For convenience of the description, a scan line in an (i−1)-th row is labeled "Si−1", a scan line in an i-th row is labeled "Si", a scan line in an (i+1)-th row is labeled "Si+1", an emission control line in an i-th row is labeled "Ei", a data line in a j-th column is labeled "Dj", and a power line in a j-th column is labeled "PL".

Referring to FIGS. 5, 6, and 7, a display device constructed according to an exemplary embodiment may include a substrate SUB, a wiring unit, and pixels PXL.

The substrate SUB may include a transparent insulating material. In an exemplary embodiment, the substrate SUB may be a rigid substrate. For example, the substrate SUB may be one of a glass substrate, a quartz substrate, a glass ceramic substrate, and a crystalline glass substrate.

In another exemplary embodiment, the substrate SUB may also be a flexible substrate. In this case, the substrate SUB may be one of a film substrate including a polymer organic material and a plastic substrate. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The wiring unit may provide signals to the pixels PXL, and may include scan lines Si−1, Si, and Si+1, a data line Dj, an emission control line Ei, a power line PL, a first initialization pixel line IPL1, and a second initialization pixel line IPL2.

The scan lines Si−1, Si, and Si+1 may be extended in the first direction DR1. The scan lines Si−1, Si, and Si+1 may include an (i−1)-th scan line Si−1, an i-th scan line Si, and an (i+1)-th scan line Si+1, which are sequentially arranged in the second direction DR2. The scan lines Si−1, Si, and Si+1 may receive a scan signal. For example, the (i−1)-th scan line Si−1 may receive an (i−1)-th scan signal, the i-th scan line Si may receive an i-th scan signal, and the (i+1)-th scan line Si+1 may receive an (i+1)-th scan signal.

The emission control line Ei may be extended in the first direction DR1. The emission control line Ei may be disposed between the i-th scan line Si and the (i+1)-th scan line Si+1 to be spaced apart therefrom. The emission control line Ei may receive an emission control signal.

The data line Dj may be extended in the second direction DR2. The data line Dj may receive a data voltage.

The power line PL may be extended in the second direction DR2. The power line PL may be disposed to be spaced apart from the data line Dj. The power line PL may receive a first voltage of the first power source ELVDD.

The first initialization pixel line IPL1 and the second initialization pixel line IPL2 may be extended in the first direction DR1.

The first initialization pixel line IPL1 may be disposed between the second initialization pixel line in an (i−1)-th pixel row and the (i−1)-th scan line Si−1. The first initialization pixel line IPL1 may receive a first initialization voltage of the first initialization power source Vint1.

The second initialization pixel line IPL2 may be disposed between the (i+1)-th scan line Si+1 and the first initialization pixel line in an (i+1)-th pixel row. The second initialization pixel line IPL2 may receive a second initialization voltage of the second initialization power source Vint2.

The pixel PXL may include first to seventh transistors T1 to T7, a storage capacitor Cst, and an organic light emitting element OLED.

The first transistor T1 may include a first gate electrode GE1, a first active pattern ACT1, a first source electrode SE1, a first drain electrode DE1, and a connection line CNL.

The first gate electrode GE1 may be connected to a third drain electrode DE3 of the third transistor T3 and a fourth drain electrode DE4 of the fourth transistor T4. The connection line CNL may connect the first gate electrode GE1 and a space between the third drain electrode DE3 and the fourth drain electrode DE4. One end of the connection line CNL may be connected to the first gate electrode GE1 through a first contact hole CH1, and the other end of the connection line CNL may be connected to the third drain electrode DE3 and the fourth drain electrode DE4 through a second contact hole CH2.

In an exemplary embodiment, the first active pattern ACT1, the first source electrode SE1, and the first drain electrode DE1 may be formed of a semiconductor layer, which may or may not be doped with impurities. For example, the first source electrode SE1 and the first drain electrode DE1 may be formed of a semiconductor layer that is doped with impurities, and the first active pattern ACT1 may be formed of a semiconductor layer that is not doped with impurities.

The first active pattern ACT1 may have a bar shape extended in a predetermined direction, and may have a shape that is bent several times in an extended longitudinal direction. The first active pattern ACT1 may overlap the first gate electrode GE1 in a plan view. The first active pattern ACT1 may be formed such that a channel area of the first transistor T1 may be formed long. Accordingly, a driving range of a gate voltage applied to the first transistor T1 may be widened. Accordingly, a gray scale of light emitted from the organic light emitting element OLED may be finely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, a second source electrode SE2, and a second drain electrode DE2.

The second gate electrode GE2 may be connected to the i-th scan line Si. The second gate electrode GE2 may be provided as a part of the i-th scan line Si, or in a shape protruding from the i-th scan line Si.

In an exemplary embodiment, the second active pattern ACT2, the second source electrode SE2, and the second drain electrode DE2 may be formed of a semiconductor layer, which may or may not be doped with impurities. For example, the second source electrode SE2 and the second drain electrode DE2 may be formed of a semiconductor layer that is doped with impurities, and the second active pattern ACT2 may be formed of a semiconductor layer that is not doped with impurities. The second active pattern ACT2 may correspond to a portion overlapping the second gate electrode GE2.

One end of the second source electrode SE2 may be connected to the second active pattern ACT2. The other end of the second source electrode SE2 may be connected to the data line Dj through a sixth contact hole CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may be provided in a dual gate structure for preventing or suppressing a leakage current. That is, the third transistor T3 may include a 3a-th transistor T3a and a 3b-th transistor T3b. The 3a-th transistor T3a may include a 3a-th gate electrode GE3a, a 3a-th active pattern ACT3a, a 3a-th source electrode SE3a, and a 3a-th drain electrode DE3a. The 3b-th transistor T3b may include a 3b-th gate electrode GE3b, a 3b-th active pattern ACT3b, a 3b-th source electrode SE3b, and a 3b-th drain electrode DE3b. Hereinafter, the 3a-th gate electrode GE3a and the 3b-th gate electrode GE3b will be referred to as a third gate electrode GE3, the 3a-th active pattern ACT3a and the 3b-th active pattern ACT3b will be referred to as a third active pattern ACT3, the 3a-th source electrode SE3a and the 3b-th source electrode SE3b will be referred to as a third source electrode SE3, and the 3a-th drain electrode DE3a and the 3b-th drain electrode DE3b will be referred to as a third drain electrode DE3.

The third gate electrode GE3 may be connected to the i-th scan line Si. The third gate electrode GE3 may be provided as a part of the i-th scan line Si, or in a shape protruding from the i-th scan line Si. For example, the 3a-th gate electrode GE3a may be provided as a part of the i-th scan line Si, and the 3b-th gate electrode GE3b may be provided in a shape protruding from the i-th scan line Si.

The third active pattern ACT3, the third source electrode SE3, and the third drain electrode DE3 may be formed of a semiconductor layer that is or is not doped with impurities. For example, the third source electrode SE3 and the third drain electrode DE3 may be formed of a semiconductor layer that is doped with impurities, and the third active pattern ACT3 may be formed of a semiconductor layer that is not doped with impurities. The third active pattern ACT3 may correspond to a portion overlapping the third gate electrode GE3.

One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. Further, the third drain electrode DE3 may be connected to the first gate electrode GE1 of the first transistor T1 through the connection line CNL, the second contact hole CH2, and the first contact hole CH1.

The fourth transistor T4 may be provided in a dual gate structure for preventing or suppressing a leakage current. That is, the fourth transistor T4 may include a 4a-th transistor T4a and a 4b-th transistor T4b. The 4a-th transistor T4a may include a 4a-th gate electrode GE4a, a 4a-th active pattern ACT4a, a 4a-th source electrode SE4a, and a 4a-th drain electrode DE4a. The 4b-th transistor T4b may include a 4b-th gate electrode GE4b, a 4b-th active pattern ACT4b, a 4b-th source electrode SE4b, and a 4b-th drain electrode DE4b. Hereinafter, the 4b-th gate electrode GE4a and the 4b-th gate electrode GE4b will be referred to as a fourth gate electrode GE4, the 4a-th active pattern ACT4a and the 4b-th active pattern ACT4b will be referred to as a fourth active pattern ACT4, the 4a-th source electrode SE4a and the 4b-th source electrode SE4b will be referred to as a fourth source electrode SE4, and the 4a-th drain electrode DE4a and the 4b-th drain electrode DE4b will be referred to as a fourth drain electrode DE4.

The fourth gate electrode GE4 may be connected to the (i−1)-th scan line Si−1. The fourth gate electrode GE4 may be provided as a part of the (i−1)-th scan line Si−1, or in a shape protruding from the (i−1)-th scan line Si−1. For example, the 4a-th gate electrode GE4a may be provided as a part of the (i−1)-th scan line Si−1, and the 4b-th gate electrode GE4b may be provided in a shape protruding from the (i−1)-th scan line Si−1.

The fourth active pattern ACT4, the fourth source electrode SE4, and the fourth drain electrode DE4 may be formed of a semiconductor layer that is or is not doped with impurities. For example, the fourth source electrode SE4 and the fourth drain electrode DE4 may be formed of a semiconductor layer that is doped with impurities, and the fourth active pattern ACT4 may be formed of a semiconductor layer that is not doped with impurities. The fourth active pattern ACT4 may correspond to a portion overlapping the fourth gate electrode GE4.

One end of the fourth source electrode SE4 may be connected to the fourth active pattern ACT4. The other end of the fourth source electrode SE4 may be connected to the first initialization pixel line IPL1 and a seventh drain electrode DE7 of a seventh transistor T7 of a pixel in an (i−1)-th pixel row. The other end of the fourth source electrode SE4 may be connected to the first initialization pixel line IPL1 through an eleventh contact hole CH11. An auxiliary connection line AUX may be provided between the fourth source electrode SE4 and the seventh drain electrode DE7 of the seventh transistor T7 of the pixel in the (i−1)-th pixel row. One end of the auxiliary connection line AUX may be connected to the fourth source electrode SE4 through a ninth contact hole CH9. The other end of the auxiliary connection line AUX may be connected to a second initialization pixel line IPL2 in the (i−1)-th pixel row through an eighth contact hole CH8 of the pixel in the (i−1)-th pixel row. Further, a part of the auxiliary connection line AUX may be connected to the first initialization pixel line IPL1 through the eleventh contact hole CH11.

One end of the fourth drain electrode DE4 may be connected to the fourth active pattern ACT4. The other end of the fourth drain electrode DE4 may be connected to the third drain electrode DE3 of the third transistor T3. The fourth drain electrode DE4 may also be connected to the first gate electrode GE1 of the first transistor T1 through the connection line CNL, the second contact hole CH2, and the first contact hole CH1.

The fifth transistor T5 may include a fifth gate electrode GE5, a fifth active pattern ACT5, a fifth source electrode SE5, and a fifth drain electrode DE5.

The fifth gate electrode GE5 may be connected to the emission control line Ei. The fifth gate electrode GE5 may be provided as a part of the emission control line Ei or in a shape protruding from the emission control line Ei.

The fifth active pattern ACT5, the fifth source electrode SE5, and the fifth drain electrode DE5 may be formed of a semiconductor layer that is or is not doped with impurities. For example, the fifth source electrode SE5 and the fifth drain electrode DE5 may be formed of a semiconductor layer that is doped with impurities, and the fifth active pattern ACT5 may be formed of a semiconductor layer that is not doped with impurities. The fifth active pattern ACT5 corresponds to a portion overlapping the fifth gate electrode GE5.

One end of the fifth source electrode SE5 may be connected to the fifth active pattern ACT5. The other end of the fifth source electrode SE5 may be connected to the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, a sixth source electrode SE6, and a sixth drain electrode DE6.

The sixth gate electrode GE6 may be connected to the emission control line Ei. The sixth gate electrode GE6 may be provided as a part of the emission control line Ei or in a shape protruding from the emission control line Ei. The sixth active pattern ACT6, the sixth source electrode SE6, and the sixth drain electrode DE6 may be formed of a semiconductor layer that is or is not doped with impurities. For example, the sixth source electrode SE6 and the sixth drain electrode DE6 may be formed of a semiconductor layer that is doped with impurities, and the sixth active pattern ACT6 may be formed of a semiconductor layer that is not doped with impurities. The sixth active pattern ACT6 corresponds to a portion overlapping the sixth gate electrode GE6.

One end of the sixth source electrode SE6 may be connected to the sixth active pattern ACT6. The other end of the sixth source electrode SE6 may be connected with the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, a seventh source electrode SE7, and a seventh drain electrode DE7.

The seventh gate electrode GE7 may be connected to the (i+1)-th scan line Si+1. The seventh gate electrode GE7 may be provided as a part of the (i+1)-th scan line Si+1, or in a shape protruding from the (i+1)-th scan line Si+1. The seventh active pattern ACT7, the seventh source electrode SE7, and the seventh drain electrode DE7 may be formed of a semiconductor layer that is or is not doped with impurities. For example, the seventh source electrode SE7 and the seventh drain electrode DE7 may be formed of a semiconductor layer that is doped with impurities, and the seventh active pattern ACT7 may be formed of a semiconductor layer that is not doped with impurities. The seventh active pattern ACT7 may correspond to a portion overlapping the seventh gate electrode GE7.

One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the second initialization pixel line IPL2. Further, the seventh drain electrode DE7 may be connected to a fourth source electrode SE4 of a fourth transistor T4 of a pixel in an (i+1)-th pixel row. The seventh drain electrode DE7 and the fourth source electrode SE4 of the fourth transistor T4 of the pixel in the (i+1)-th pixel row may be connected.

The storage capacitor Cst may include a lower electrode LE and an upper electrode UE. The lower electrode LE may be formed of the first gate electrode GE1 of the first transistor T1.

The upper electrode UE may overlap the first gate electrode GE1, and may cover the lower electrode LE in a plan view. Capacitance of the storage capacitor Cst may increase by increasing an overlapping area of the upper electrode UE and the lower electrode LE. The upper electrode UE may be extended in the first direction DR1. In an exemplary embodiment, a first voltage of the first power source ELVDD may be applied to the upper electrode UE. The upper electrode UE may have an opening OPN in an area, in which the first contact hole CH1, through which the first gate electrode GE1 contacts the connection line CNL, is formed.

The organic light emitting element OLED may include a first electrode AD, a second electrode CD, and an emission layer EML disposed between the first electrode AD and the second electrode CD.

The first electrode AD may be disposed within an emission area corresponding to each pixel PXL. The first electrode AD may be connected to the seventh source electrode SE7 of the seventh transistor T7 and the sixth drain electrode DE6 of the sixth transistor T6 through a seventh contact hole CH7, a tenth contact hole CH10, and a twelfth contact hole CH12. A first bridge pattern BRP1 may be provided between the seventh contact hole CH7 and the tenth contact hole CH10. The first bridge pattern BRP1 may connect the sixth drain electrode DE6, the seventh source electrode SE7, and the first electrode AD.

Hereinafter, a structure of a display device constructed according to an exemplary embodiment will be described in a stacking sequence with reference to FIGS. 5, 6, and 7.

Active patterns ACT1 to ACT7 may be disposed on a substrate SUB. The active patterns ACT1 to ACT7 may include a first active pattern ACT1 to a seventh active pattern ACT7. The active patterns ACT1 to ACT7 may be formed of a semiconductor material. In an exemplary embodiment, a buffer layer may be disposed between the substrate SUB and the active patterns ACT1 to ACT7.

A gate insulation layer GI may be disposed on the substrate SUB on which the active patterns ACT1 to ACT7 are formed.

An (i−1)-th scan line Si−1, an i-th scan line Si, an (i+1)-th scan line Si+1, an emission control line Ei, and first to seventh gate electrodes GE1 to GE7 may be disposed on the gate insulation layer GI. The first gate electrode GE1 may be the lower electrode LE of the storage capacitor Cst. The second gate electrode GE2 and the third gate electrode GE3 may be integrally formed with the i-th scan line Si. The fourth gate electrode GE4 may be integrally formed with the (i−1)-th scan line Si−1. The fifth gate electrode GE5 and the sixth gate electrode GE6 may be integrally formed with the emission control line Ei. The seventh gate electrode GE7 may be integrally formed with the (i+1)-th scan line Si+1.

A first insulation layer IL1 may be disposed on the substrate SUB on which the (i−1)-th scan line Si−1, the i-th scan line Si, the (i+1)-th scan line Si+1, the emission control line Ei, and the first to seventh gate electrodes GE1 to GE7 are formed.

The upper electrode UE of the storage capacitor Cst, the first initialization pixel line IPL1, and the second initialization pixel line IPL2 may be disposed on the first insulation layer IL1. The upper electrode UE may cover or overlap the lower electrode LE. The upper electrode UE may form the storage capacitor Cst together with the lower electrode LE with the first insulation layer IL1 interposed therebetween.

A second insulation layer IL2 may be disposed on the substrate SUB on which the upper electrode UE, the first initialization pixel line IPL1, and the second initialization pixel line IPL2 are formed.

A data line Dj, a connection line CNL, an auxiliary connection line AUX, and a first bridge pattern BRP1 may be disposed on the second insulation layer IL2.

The data line Dj may be connected to the second source electrode SE2 through the sixth contact hole CH6 that passes through the gate insulation layer GI, the first insulation layer IL1, and the second insulation layer IL2.

The connection line CNL may be connected to the first gate electrode GE1 through the first contact hole CH1 that passes through the first insulation layer IL1 and the second insulation layer IL2. Further, the connection line CNL may be connected to the third drain electrode DE3 and the fourth drain electrode DE4 through the second contact hole CH2 that passes through the gate insulation layer GI, the first insulation layer IL1, and the second insulation layer IL2.

The auxiliary connection line AUX may be connected to the second initialization pixel line IPL2 through the eighth contact hole CH8 that passes through the second insulation layer IL2. Further, the auxiliary connection line AUX may be connected to the fourth source electrode SE4 and the seventh drain electrode DE7 of a pixel in an (i−1)-th pixel row through the ninth contact hole CH9 that passes through the gate insulation layer GI, the first insulation layer IL1, and the second insulation layer IL2.

The first bridge pattern BRP1 may connect the sixth drain electrode DE6 and the first electrode AD between the sixth drain electrode DE6 and the first electrode AD. The first bridge pattern BRP1 may be connected to the sixth drain electrode DE6 and the seventh source electrode SE7 through the seventh contact hole CH7 that passes through the gate insulation layer GI, the first insulation layer IL1, and the second insulation layer IL2.

A third insulation layer IL3 may be disposed on the substrate SUB on which the data line Dj, the connection line CNL, the auxiliary connection line AUX, and the first bridge pattern BRP1 are formed.

A power line PL and a second bridge pattern BRP2 may be disposed on the third insulation layer IL3. The second bridge pattern BRP2 may be connected to the first bridge pattern BRP1 through the tenth contact hole CH10.

A passivation layer PSV may be disposed on the substrate SUB on which the power line PL and the second bridge pattern BRP2 are formed.

The organic light emitting element OLED may be disposed on the passivation layer PSV. The organic light emitting element OLED may include a first electrode AD, a second electrode CD, and an emission layer EML disposed between the first electrode AD and the second electrode CD.

The first electrode AD may be disposed on the passivation layer PSV. The first electrode AD may be connected to the second bridge pattern BRP2 through the twelfth contact hole CH12 that passes through the passivation layer PSV. Accordingly, the first electrode AD may be electrically connected to the first bridge pattern BRP1. The first bridge pattern BRP1 may be connected to the sixth drain electrode DE6 and the seventh source electrode SE7 through the seventh contact hole CH7, so that the first electrode AD may be electrically connected to the sixth drain electrode DE6 and the seventh source electrode SE7.

A pixel defining layer PDL, which divides the emission area to correspond to each pixel PXL, may be disposed on the substrate SUB on which the first electrode AD is formed. The pixel defining layer PDL may protrude from the substrate SUB along a perimeter of the pixel PXL while exposing an upper surface of the first electrode AD.

The emission layer EML may be disposed in the emission area surrounded by the pixel defining layer PDL, and the second electrode CD may be disposed on the emission layer EML. A sealing layer SLM covering the second electrode CD may be disposed on the second electrode CD.

One of the first electrode AD and the second electrode CD may be an anode electrode, and the other may be a cathode electrode. For example, the first electrode AD may be an anode electrode, and the second electrode CD may be a cathode electrode.

At least one of the first electrode AD and the second electrode CD may be a transmissive electrode. For example, when the organic light emitting element OLED is a bottom emission organic light emitting element, the first electrode AD may be a transmissive electrode, and the second electrode CD may be a reflective electrode. For example, when the organic light emitting element OLED is a top emission organic light emitting element, the first electrode AD may be a reflective electrode, and the second electrode CD may be a transmissive electrode. For example, when the organic light emitting element OLED is a dual-type organic light emitting element, both the first electrode AD and the second electrode CD may be transmissive electrodes. In the present embodiment, a case in which the organic light emitting element OLED is the top emission organic light emitting element, and the first electrode AD is an anode electrode will be described as an example.

The first electrode AD may include a reflective layer, which is capable of reflecting light, and a transparent conductive layer disposed above and/or under the reflective layer. At least one of the transparent conductive layer and the reflective layer may be connected to the seventh source electrode SE7.

The reflective layer may include a material that is capable of reflecting light. For example, the reflective layer may include at least one of aluminum (Al), silver (Ag), chrome (Cr), molybdenum (Mo), platinum (Pt), nickel (N1), and an alloy thereof.

The transparent conductive layer may include a transparent conductive oxide. For example, the transparent conductive layer may include at least one transparent conductive oxide among an indium tin oxide (ITO), an indium zinc oxide (IZO), an aluminum zinc oxide (AZO), a gallium-doped zinc oxide (GZO), a zinc tin oxide (ZTO), a Gallium tin oxide (GTO), and a fluorine-doped tin oxide (FTO).

The pixel defining layer PDL may include an organic insulating material. For example, the pixel defining layer PDL may include at least one of polystyrene, polymethylmetaacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emission layer EML may be disposed on an exposed surface of the first electrode AD. The emission layer EML may have a multi-layer thin film structure including a light generation layer LGL. For example, the emission layer EML may include a hole injection layer HIL for injecting holes, a hole transport layer HTL, the light generation layer, a hole blocking layer HBL, an electron transport layer ETL, and an electron injection layer EIL for injecting electrons. The hole transport layer HTL may have an excellent hole transporting property and suppress the movement of electrons that have failed to be combined in the light generation layer so as to increase the opportunity for the holes and the electrons to be re-combined. The light generating layer may emit light by the re-combination of the injected electrons and holes. The hole blocking layer HBL may suppress the movement of holes that have failed to be combined in the light generating layer. The electron transport layer ETL may smoothly transport electrons to the light generating layer.

A color of light generated in the light generation layer may be one of red, green, blue, and white, however, the present embodiment is not limited thereto. For example, a color of light generated in the light generation layer of the emission layer EML may be one of magenta, cyan, and yellow.

The hole injection layer, the hole transport layer, the hole blocking layer, the electron transport layer, and the electron injection layer may be common layers connected in the adjacent emission areas.

The second electrode CD may be a semi-transmissive reflective layer. For example, the second electrode CD may be a thin metal layer having a thickness in which light emitted from the emission layer EML may pass through. The second electrode CD may transmit a part of light emitted from the emission layer EML, and may reflect the residue of the light emitted from the emission layer EML.

The second electrode CD may include a material having a lower work function than that of the transparent conductive layer. For example, the second electrode CD may include at least one of molybdenum (Mo), tungsten (W), silver (Ag), magnesium (Mg), aluminum (Al), platinum (Pt), palladium (Pd), gold (Au), nickel (N1), neodymium (Nd), iridium (Ir), chrome (Cr), lithium (Li), calcium (Ca), and an alloy thereof.

The sealing layer SLM may prevent or suppress oxygen and moisture from permeating into the organic light emitting element OLED. The sealing layer SLM may include a plurality of inorganic layers and a plurality of organic layers. For example, the inorganic layer may be disposed in the uppermost portion of the sealing layer SLM. The inorganic layer may include at least one of a silicon oxide, a silicon nitride, a silicon oxynitride, an aluminum oxide, a titanium oxide, a zirconium oxide, and a tin oxide.

Hereinafter, the peripheral area PPA illustrated in FIG. 3 according to an exemplary embodiment will be described with reference to FIGS. 8, 9, 10, 11, and 12.

Figure 8:
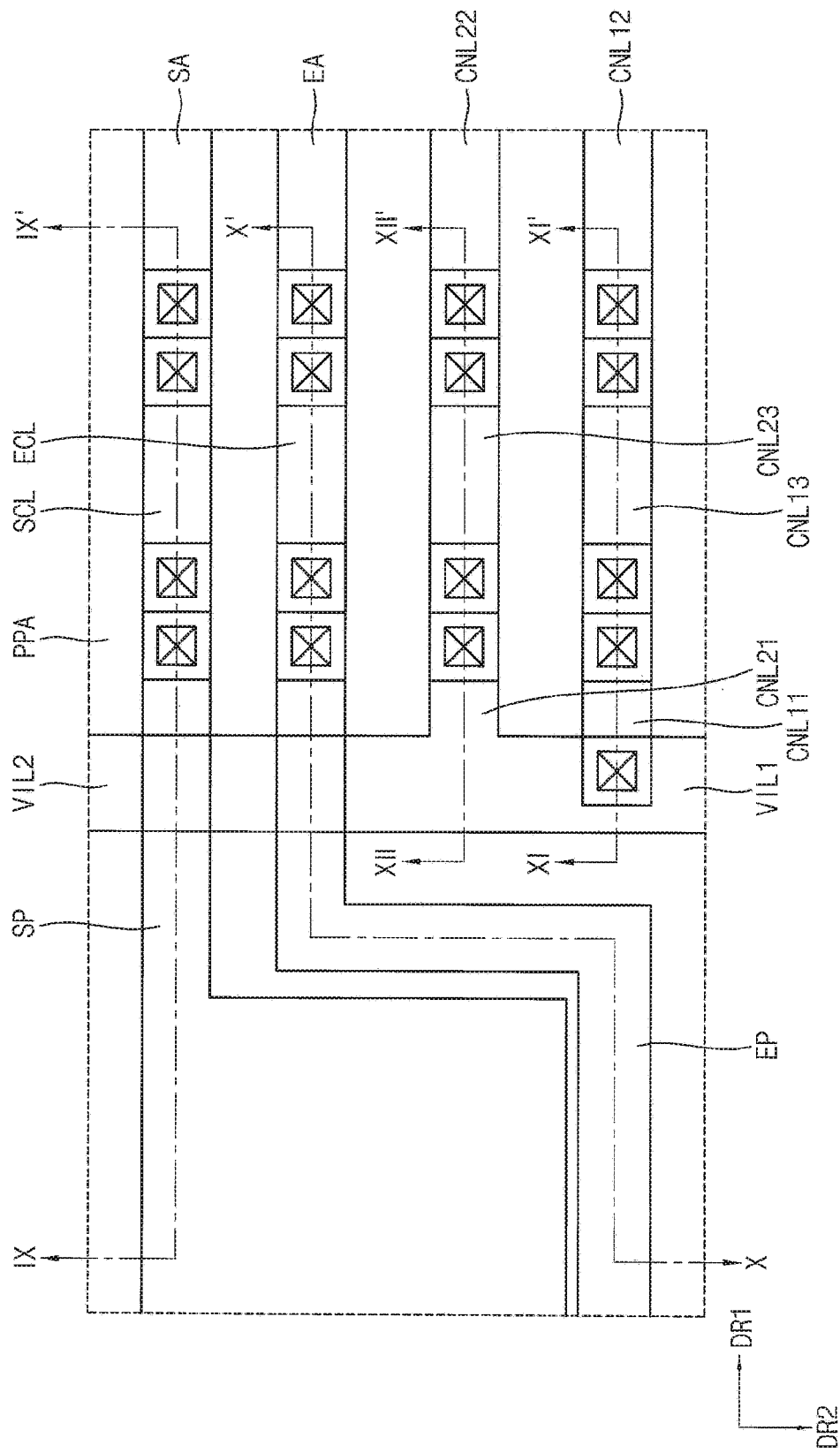
FIG. 8 is a plan view illustrating a peripheral area of a display device constructed according to an embodiment.
Figure 9:
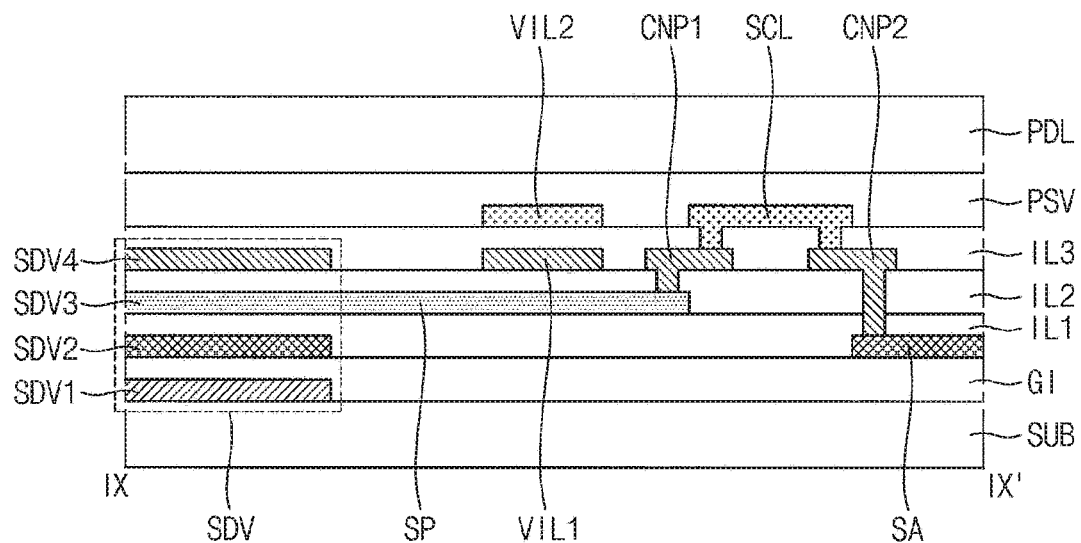
FIG. 9 is a cross-sectional view taken along a sectional line IX-IX' in FIG. 8.
Figure 10:
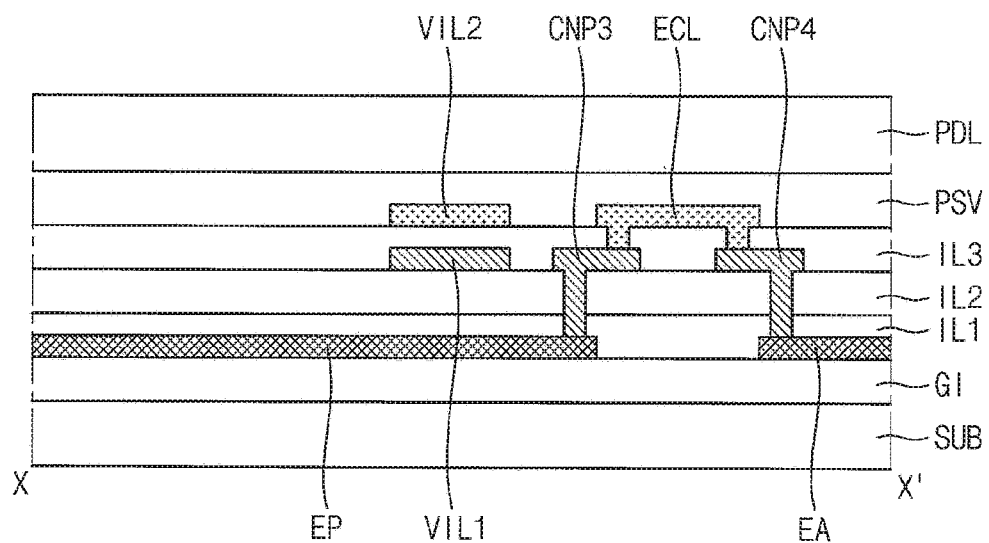
FIG. 10 is a cross-sectional view taken along a sectional line X-X' in FIG. 8.
Figure 11:
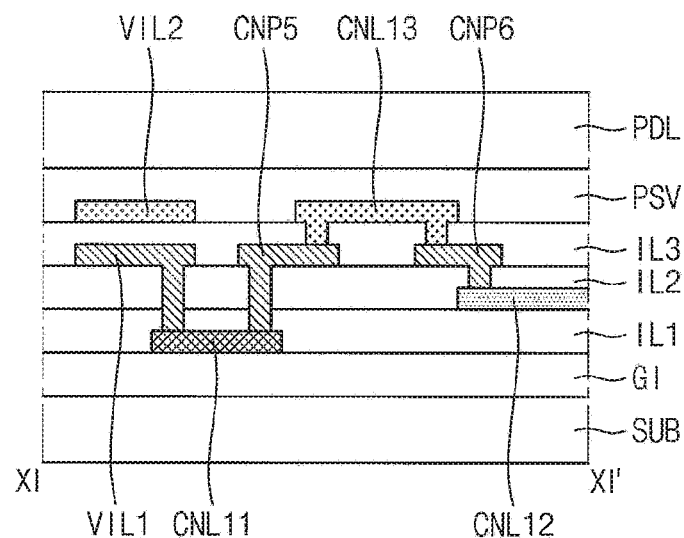
FIG. 11 is a cross-sectional view taken along a sectional line XI-XI' in FIG. 8.
Figure 12:
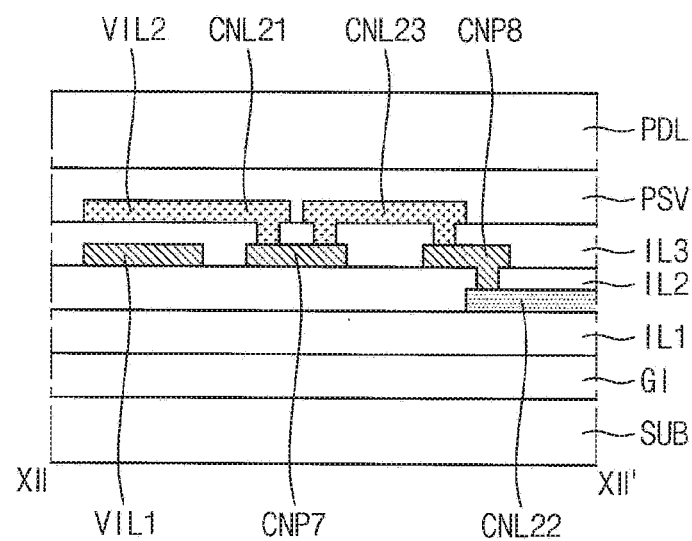
FIG. 12 is a cross-sectional view taken along a sectional line XII-XII' in FIG. 8.

FIG. 8 is a plan view illustrating a peripheral area of a display device constructed according to an exemplary embodiment. FIG. 9 is a cross-sectional view taken along a sectional line IX-IX' in FIG. 8. FIG. 10 is a cross-sectional view taken along a sectional line X-X' in FIG. 8. FIG. 11 is a cross-sectional view taken along a sectional line XI-XI' in FIG. 8. FIG. 12 is a cross-sectional view taken along a sectional line XII-XII' in FIG. 8.

FIGS. 8, 9, 10, 11, and 12 illustrate a location of lines and a connection relation between the lines in detail. For convenience of the description, FIGS. 8, 9, 10, 11, and 12 illustrate mainly lines connected to one pixel row of a pixel area.

Referring to FIGS. 8, 9, 10, 11, and 12, a driver unit including a scan driver SDV and an emission driver, a scan line, an emission control line, a first initialization line VIL1, and a second initialization line VIL2 may be disposed within a peripheral area PPA of the display device constructed according to an exemplary embodiment.

The scan driver SDV may include a scan active pattern SDV1 disposed on a substrate SUB, a first scan conductive portion SDV2 disposed on a gate insulation layer GI, a second scan conductive portion SDV3 disposed on a first insulation layer IL1, and a third scan conductive portion SDV4 disposed on a second insulation layer IL2. That is, the scan active pattern SDV1 may be disposed on the same layer as those of the active patterns ACT1 to ACT7 of the pixel PXL illustrated in FIGS. 5, 6, and 7 and include the same material as those of the active patterns ACT1 to ACT7, and the first scan conductive portion SDV2 may be disposed on the same layer as those of the emission control line Ei and the scan lines Si−1, Si, and Si+1 of the pixel PXL illustrated in FIGS. 5, 6, and 7 and include the same material as those of the emission control line Ei and the scan lines Si−1, Si, and Si+1. Further, the second scan conductive portion SDV3 may be disposed on the same layer as that of the upper electrode UE of the pixel PXL illustrated in FIGS. 5, 6, and 7 and include the same material as that of the upper electrode UE, and the third scan conductive portion SDV4 may be disposed on the same layer as those of the data line Dj and the connection line CNL of the pixel PXL illustrated in FIGS. 5, 6, and 7 and include the same material as those of the data line Dj and the connection line CNL.

The scan line may be extended in the first direction DR1 from the scan driver SDV. The scan line may include a scan driver connecting portion SP connected to the scan driver SDV, a scan pixel connecting portion SA connected to the pixel row and providing a scan signal to the pixel row, a scan line connecting portion SCL connecting the scan driver connecting portion SP and the scan pixel connecting portion SA.

The scan driver connecting portion SP may be disposed on the first insulation layer IL1, and may be electrically connected to the scan line connecting portion SCL. That is, the scan driver connecting portion SP may be disposed on the same layer as that of the second scan conductive portion SDV3, and may include the same material as that of the second scan conductive portion SDV3. Here, the scan driver connecting portion SP may be electrically connected to the scan line connecting portion SCL through a first contact pad CNP1 disposed on the second insulation layer IL2.

The scan pixel connecting portion SA may be disposed on the gate insulation layer GI, and may be electrically connected to the scan line connecting portion SCL through a second contact pad CNP2. That is, the scan pixel connecting portion SA may be disposed on the same layer as that of the first scan conductive portion SDV2, and may have the same material as that of the first scan conductive portion SDV2.

The scan line connecting portion SCL may be disposed on the third insulation layer IL3. That is, the scan line connecting portion SCL may be disposed on the same layer as those of the second bridge pattern BRP2 and the power line PL illustrated in FIGS. 5, 6, and 7, and may include the same material as those of the second bridge pattern BRP2 and the power line PL.

The emission control line may be substantially extended in the first direction DR1 from the emission driver, and may be spaced apart from the scan line in the second direction DR2. The emission control line may include an emission driver connecting portion EP connected to the emission driver, an emission pixel connecting portion EA connected to the pixel row and providing an emission control signal, and an emission control line connecting portion ECL connecting the emission driver connecting portion EP and the emission pixel connecting portion EA.

The emission driver connecting portion EP may be disposed on the gate insulation layer GI, and may be electrically connected to the emission control line connecting portion ECL through a third contact pad CNP3 disposed on the second insulation layer IL2. That is, the emission driver connecting portion EP may be disposed on the same layer as that of the scan pixel connecting portion SA, and may include the same material as that of the scan pixel connecting portion SA.

The emission pixel connecting portion EA may be disposed on the gate insulation layer GI, and may be electrically connected to the emission control line connecting portion ECL through a fourth contact pad CNP4 disposed on the second insulation layer IL2. That is, the emission pixel connecting portion EA may be disposed on the same layer as that of the emission driver connecting portion EP, and may include the same material as that of the emission driver connecting portion EP.

The emission control line connecting portion ECL may be disposed on the third insulation layer IL3. That is, the emission control line connecting portion ECL may be disposed on the same layer as that of the scan line connecting portion SCL, and may include the same material as that of the scan line connecting portion SCL.

The first initialization line VIL1 and the second initialization line VIL2 may be disposed between the scan driver SDV and the pixel area within the peripheral area PPA, and may be extended in the second direction DR2. The first initialization line VIL1 may provide one of the first initialization voltage and the second initialization voltage to the pixels, and the second initialization line VIL2 may provide the other of the first initialization voltage and the second initialization voltage to the pixels.

The second initialization line VIL2 may overlap at least a portion of the first initialization line VIL1. That is, the first initialization line VIL1 and the second initialization line VIL2 may be at least partially overlapped with each other in a plan view. In an exemplary embodiment, the second initialization line VIL2 may overlap an entirety of the first initialization line VIL1. That is, a width of the first initialization line VIL1 may be substantially the same as a width of the second initialization line VIL2, and the first initialization line VIL1 and the second initialization line VIL2 may be substantially overlapped with each other in a plan view.

If a first initialization line and a second initialization line, which are not overlapped with each other, are disposed between the scan driver SDV and the pixel area, a width of the peripheral area PPA may increase by at least the addition of a width of the first initialization line, a width of the second initialization line, and a distance between the first initialization line and the second initialization line, and thus, a dead space of the display device may increase. However, in the present embodiment, the first initialization line VIL1 and the second initialization line VIL2 may be at least partially overlapped with each other, so that a width of the peripheral area PPA may be decreased, and thus, a dead space of the display device may be decreased.

The first initialization line VIL1 may be disposed on the second insulation layer IL2, and the second initialization line VIL2 may be disposed on the third insulation layer IL3. That is, the first initialization line VIL1 may be disposed on the same layer as that of the third scan conductive portion SDV4 and include the same material as that of the third scan conductive portion SDV4, and the second initialization line VIL2 may be disposed on the same layer as those of the scan line connecting portion SCL and the emission control line connecting portion ECL, and may include the same material as those of the scan line connecting portion SCL and the emission control line connecting portion ECL.

The scan line may cross the first initialization line VIL1 and the second initialization line VIL2. Specifically, the scan driver connecting portion SP may cross the first initialization line VIL1 and the second initialization line VIL2. Since the scan driver connecting portion SP is disposed on the first insulation layer IL1, the scan driver connecting portion SP may cross the first initialization line VIL1 disposed on the second insulation layer IL2 and the second initialization line VIL2 disposed on the third insulation layer IL3 with being insulated therefrom.

The first initialization line VIL1 may be connected to the pixel row through a first connecting line CNL11, CNL12, and CNL13 extended in the first direction DR1. The first connecting line CNL11, CNL12, and CNL13 may include a first connecting portion CNL11 connected to the first initialization line VIL1, a second connecting portion CNL12 connected to the pixel row, and a third connecting portion CNL13 connecting the first connecting portion CNL11 and the second connecting portion CNL12.

The first connecting portion CNL11 may be disposed on the gate insulation layer GI, and may be electrically connected to the third connecting portion CNL13 through a fifth contact pad CNP5 disposed on the second insulation layer IL2. That is, the first connecting portion CNL11 may be disposed on the same layer as that of the emission driver connecting portion EP, and may include the same material as that of the emission driver connecting portion EP. The first connecting portion CNL11 may be in contact with the first initialization line VIL1 through a contact hole formed in the first insulation layer IL1 and the second insulation layer IL2.

The second connecting portion CNL12 may be disposed on the first insulation layer IL1, and may be electrically connected to the third connecting portion CNL13 through a sixth contact pad CNP6 disposed on the second insulation layer IL2. That is, the second connecting portion CNL12 may be disposed on the same layer as that of the scan driver connecting portion SP, and may include the same material as that of the scan driver connecting portion SP.

The third connecting portion CNL13 may be disposed on the third insulation layer IL3. That is, the third connecting portion CNL13 may be disposed on the same layer as that of the scan line connecting portion SCL, and may include the same material as that of the scan line connecting portion SCL.

The second initialization line VIL2 may be connected to the pixel row through a second connecting line CNL21, CNL22, and CNL23 extended in the first direction DR1. The second connecting line CNL21, CNL22, and CNL23 may include a fourth connecting portion CNL21 connected to the second initialization line VIL2, a fifth connecting portion CNL22 connected to the pixel row, and a sixth connecting portion CNL23 connecting the fourth connecting portion CNL21 and the fifth connecting portion CNL22.

The fourth connecting portion CNL21 may be disposed on the third insulation layer IL3, and may be electrically connected to the sixth connecting portion CNL23 through a seventh contact pad CNP7 disposed on the second insulation layer IL2. That is, the fourth connecting portion CNL21 may be disposed on the same layer as that of the second initialization line VIL2, and may include the same material as that of the second initialization line VIL2. The fourth connecting portion CNL21 may be integrally formed with the second initialization line VIL2 thereby being in contact with the second initialization line VIL2.

The fifth connecting portion CNL22 may be disposed on the first insulation layer IL1, and may be electrically connected to the sixth connecting portion CNL23 through a eighth contact pad CNP8 disposed on the second insulation layer IL2. That is, the fifth connecting portion CNL22 may be disposed on the same layer as that of the second connecting portion CNL12, and may include the same material as that of the second connecting portion CNL12.

The sixth connecting portion CNL23 may be disposed on the third insulation layer IL3. That is, the sixth connecting portion CNL23 may be disposed on the same layer as that of the third connecting portion CNL13, and may include the same material as that of the third connecting portion CNL13.

Hereinafter, the peripheral area PPA illustrated in FIG. 3 according to an exemplary embodiment will be described with reference to FIGS. 13, 14, 15, 16, and 17.

Figure 13:
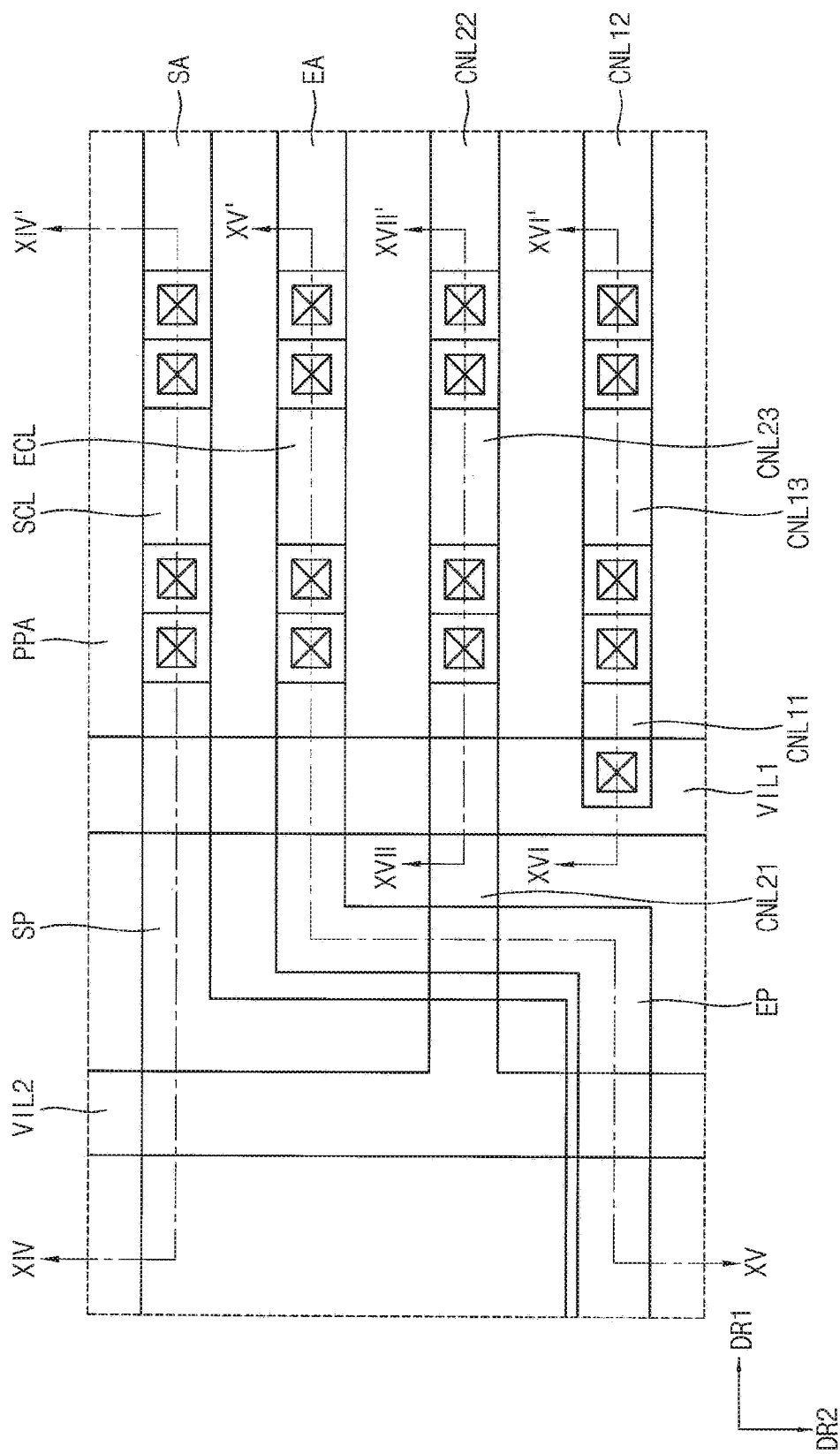
FIG. 13 is a plan view illustrating a peripheral area of a display device constructed according to an embodiment.
Figure 14:
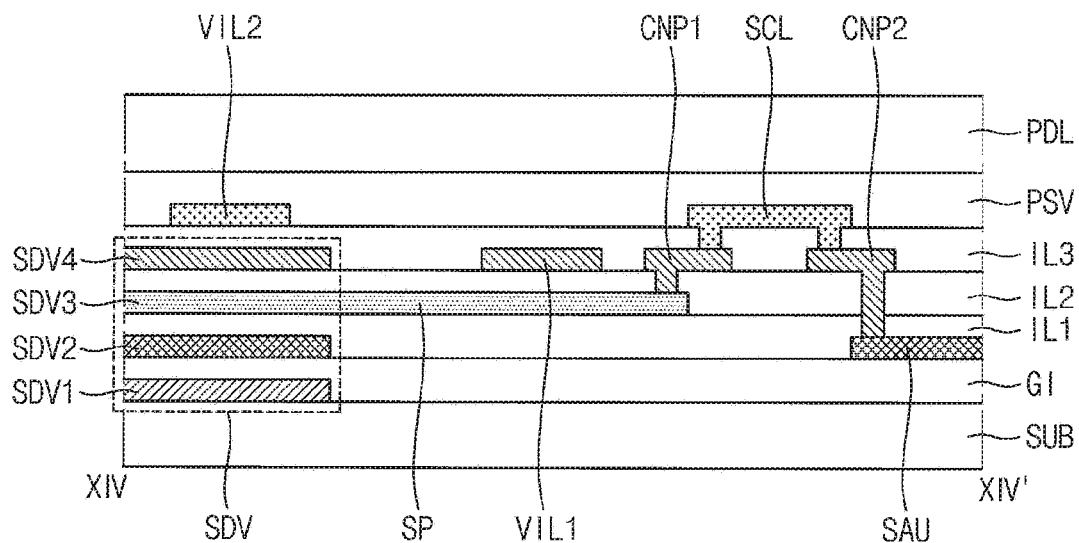
FIG. 14 is a cross-sectional view taken along a sectional line XIV-XIV' in FIG. 13.
Figure 15:
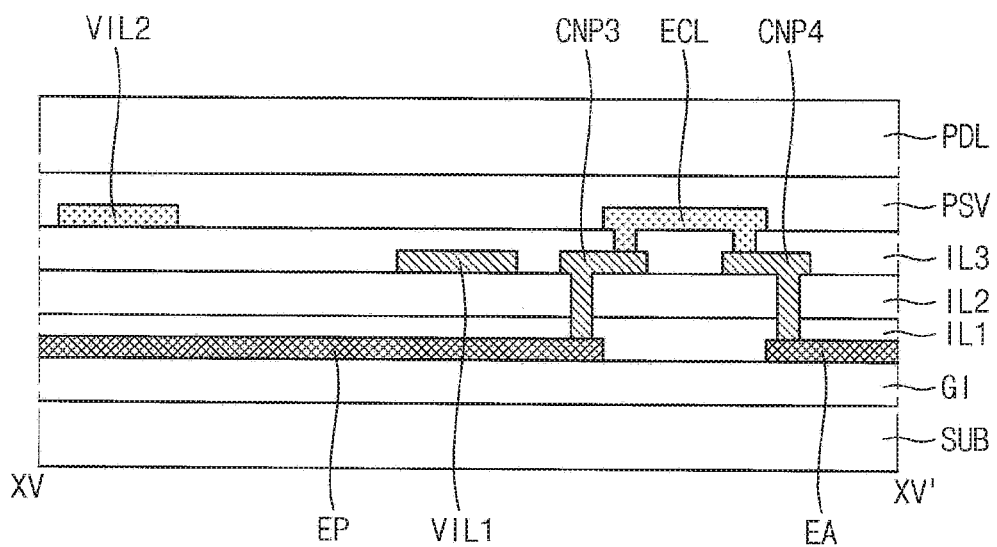
FIG. 15 is a cross-sectional view taken along a sectional line XV-XV' in FIG. 13.
Figure 16:
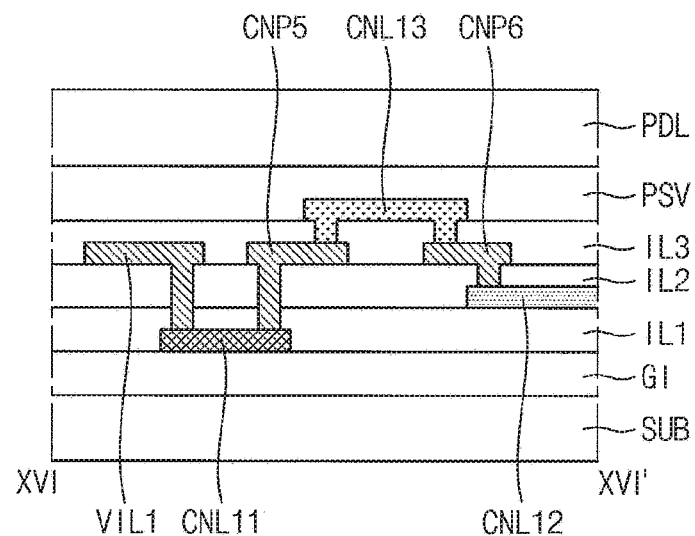
FIG. 16 is a cross-sectional view taken along a sectional line XVI-XVI' in FIG. 13.
Figure 17:
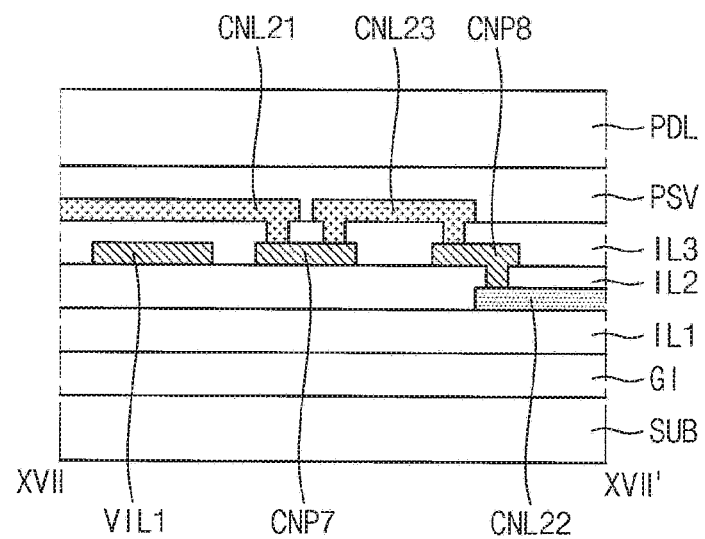
FIG. 17 is a cross-sectional view taken along a sectional line XVII-XVII' in FIG. 13.

FIG. 13 is a plan view illustrating a peripheral area of a display device constructed according to an exemplary embodiment. FIG. 14 is a cross-sectional view taken along a sectional line XIV-XIV' in FIG. 13. FIG. 15 is a cross-sectional view taken along a sectional line XV-XV' in FIG. 13. FIG. 16 is a cross-sectional view taken along a sectional line XVI-XVI' in FIG. 13. FIG. 17 is a cross-sectional view taken along a sectional line XVII-XVII' in FIG. 13.

A peripheral area of a display device constructed according to an exemplary embodiment with reference to FIGS. 13, 14, 15, 16, and 17 is substantially the same as the peripheral area of the display device constructed according to the exemplary embodiment with reference to FIGS. 8, 9, 10, 11, and 12 except for locations of the first initialization line VIL1 and the second initialization line VIL2 in a plan view, so that descriptions on substantially the same or similar elements may not be repeated.

Referring to FIGS. 13, 14, 15, 16, and 17, the second initialization line VIL2 may overlap the driver unit. The second initialization line VIL2 may not overlap the first initialization line VIL1. Since the second initialization line VIL2 overlaps the driver unit, a width of the peripheral area PPA may be decreased, and thus, a dead space of the display device may be decreased.

In an exemplary embodiment, the second initialization line VIL2 may overlap the scan driver SDV. Since the second initialization line VIL2 is disposed on the third insulation layer IL3, the second initialization line VIL2 may overlap the scan active pattern SDV1 disposed on the substrate SUB, the first scan conductive portion SDV2 disposed on the gate insulation layer GI, the second scan conductive portion SDV3 disposed on the first insulation layer IL1, and the third scan conductive portion SDV4 disposed on the second insulation layer IL2 with being insulated therefrom.

In an exemplary embodiment, a width of the second initialization line VIL2 may be greater than a width of the first initialization line VIL1. For example, a width of the second initialization line VIL2 in the first direction DR1 may be greater than a width of the first initialization line VIL1 in the first direction DR1. The scan driver SDV may have a relatively large width in the first direction DR1, and the second initialization line VIL2 overlapping the scan driver SDV may have a relatively large width.

The scan line may cross the first initialization line VIL1. Specifically, the scan driver connecting portion SP may cross the first initialization line VIL1. Since the scan driver connecting portion SP is disposed on the first insulation layer IL1, the scan driver connecting portion SP may cross the first initialization line VIL1 disposed on the second insulation layer IL2 with being insulated therefrom.

The display device constructed according to the exemplary embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device, comprising:
a substrate comprising a pixel area and a peripheral area;
a plurality of pixels disposed in the pixel area of the substrate;
a scan driver disposed in the peripheral area of the substrate;
a first initialization line disposed in the peripheral area of the substrate, the first initialization line being configured to provide a first initialization voltage to the plurality of pixels; and
a second initialization line disposed in the peripheral area of the substrate, the second initialization line being configured to provide a second initialization voltage to the plurality of pixels,
wherein at least a portion of the first initialization line overlaps with the second initialization line, and
wherein the first initialization line and the second initialization line are spaced apart from the scan driver.

2. The display device of claim 1, wherein an entirety of the first initialization line overlaps with the second initialization line.

3. The display device of claim 1, further comprising: a gate insulation layer; a first insulation layer; a second insulation layer; and a third insulation layer, sequentially stacked on the substrate,
wherein the first initialization line is disposed on the second insulation layer, and
wherein the second initialization line is disposed on the third insulation layer.

4. The display device of claim 3, further comprising: a first connecting line connecting the first initialization line to the plurality of pixels, the first connecting line comprising a first connecting portion disposed on the gate insulation layer and directly in contact with the first initialization line.

5. The display device of claim 3, further comprising: a second connecting line connecting the second initialization line to the plurality of pixels, the second connection line comprising a second connecting portion disposed on the third insulation layer and directly in contact with the second initialization line.

6. The display device of claim 3, further comprising: an emission driver disposed in the peripheral area of the substrate.

7. The display device of claim 6, wherein the scan driver is disposed between the emission driver and the pixel area, and
wherein the first initialization line and the second initialization line are disposed between the scan driver and the pixel area.

8. The display device of claim 7, further comprising: a scan line connecting the scan driver to the plurality of pixels, the scan line comprising a scan driver connecting portion disposed on the first insulation layer and crossing the first initialization line and the second initialization line.

9. The display device of claim 7, further comprising: an emission control line connecting the emission driver to the plurality of pixels, the emission control line comprising an emission driver connecting portion disposed on the gate insulation layer and crossing the first initialization line and the second initialization line.

10. The display device of claim 1, wherein the first initialization voltage is greater than the second initialization voltage.

11. The display device of claim 10, further comprising: a plurality of data lines configured to provide a data voltage to the plurality of pixels,
wherein the first initialization voltage is less than the data voltage.

12. The display device of claim 10, wherein each of the plurality of pixels comprises an anode electrode, a cathode electrode, and an emission layer disposed between the anode electrode and the cathode electrode, and
wherein the second initialization voltage is greater than a voltage applied to the cathode electrode.

13. A display device, comprising:
a substrate comprising a pixel area and a peripheral area;
a plurality of pixels disposed in the pixel area of the substrate;
a scan driver disposed in the peripheral area of the substrate;
a first initialization line disposed in the peripheral area of the substrate, the first initialization line being configured to provide a first initialization voltage to the plurality of pixels; and
a second initialization line disposed in the peripheral area of the substrate, the second initialization line being configured to provide a second initialization voltage to the plurality of pixels,
wherein the second initialization line overlaps the scan driver, and
wherein the first initialization line and the scan driver are spaced apart from each other.

14. The display device of claim 13, wherein the second initialization line does not overlap the first initialization line.

15. The display device of claim 13, wherein a width of the second initialization line is greater than a width of the first initialization line.

16. The display device of claim 13, further comprising: a gate insulation layer, a first insulation layer, a second insulation layer, and a third insulation layer sequentially stacked on the substrate,
wherein the first initialization line is disposed on the second insulation layer, and
wherein the second initialization line is disposed on the third insulation layer.

17. The display device of claim 16, further comprising: a first connecting line connecting the first initialization line to the plurality of pixels, the first connecting line comprising a first connecting portion disposed on the gate insulation layer and directly in contact with the first initialization line.

18. The display device of claim 16, further comprising: a second connecting line connecting the second initialization line to the plurality of pixels, the second connecting line comprising a second connecting portion disposed on the third insulation layer and directly in contact with the second initialization line.

19. The display device of claim 16, wherein further comprising: an emission driver and the scan driver disposed between the emission driver and the pixel area.

20. The display device of claim 19, wherein the scan driver comprises:
a scan active pattern disposed on the substrate;
a first scan conductive portion disposed on the gate insulation layer;
a second scan conductive portion disposed on the first insulation layer; and
a third scan conductive portion disposed on the second insulation layer.

21. The display device of claim 19, further comprising: a scan line connecting the scan driver to the plurality of pixels, the scan line comprises a scan driver connecting portion disposed on the first insulation layer and crossing the first initialization line.

22. The display device of claim 19, further comprising: an emission control line connecting the emission driver to the plurality of pixels, the emission control line comprises an emission driver connecting portion disposed on the gate insulation layer and crossing the first initialization line and the second initialization line.

23. The display device of claim 13, wherein the first initialization voltage is greater than the second initialization voltage.

24. The display device of claim 23, further comprising: a plurality of data lines configured to provide a data voltage to the plurality of pixels,
   wherein the first initialization voltage is less than the data voltage.

25. The display device of claim 23, wherein each of the plurality of pixels comprises an anode electrode, a cathode electrode, and an emission layer disposed between the anode electrode and the cathode electrode; and
   wherein the second initialization voltage is greater than a voltage applied to the cathode electrode.

* * * * *